(12) United States Patent
Wu et al.

(10) Patent No.: US 11,004,691 B2
(45) Date of Patent: May 11, 2021

(54) MECHANISM FOR MANUFACTURING SEMICONDUCTOR DEVICE

(71) Applicant: TAIWAN SEMICONDUCTOR MANUFACTURING CO., LTD., Hsinchu (TW)

(72) Inventors: Chen-Hao Wu, Hsinchu (TW); Shen-Nan Lee, Hsinchu County (TW); Chung-Wei Hsu, Hsinchu County (TW); Tsung-Ling Tsai, Hsinchu (TW); Teng-Chun Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/714,600

(22) Filed: Dec. 13, 2019

(65) Prior Publication Data
US 2020/0118833 A1    Apr. 16, 2020

Related U.S. Application Data

(63) Continuation of application No. 16/053,981, filed on Aug. 3, 2018, now Pat. No. 10,510,555.
(Continued)

(51) Int. Cl.
*H01L 21/321* (2006.01)
*H01L 21/3105* (2006.01)
(Continued)

(52) U.S. Cl.
CPC .... *H01L 21/3212* (2013.01); *H01L 21/31051* (2013.01); *H01L 21/76802* (2013.01);
(Continued)

(58) Field of Classification Search
None
See application file for complete search history.

(56) References Cited

U.S. PATENT DOCUMENTS

| 2004/0060502 A1 | 4/2004 | Singh |
| 2006/0249482 A1 | 11/2006 | Wrschka |
| (Continued) | | |

OTHER PUBLICATIONS

Miguel A. Bleza et al., "Boric Acid Adsorption on Magnetite and Zirconium Dioxide", Journal of Colloid and Interface Science, vol. 99, No. 1, May 1984, 32-40.

*Primary Examiner* — Asok K Sarkar
(74) *Attorney, Agent, or Firm* — Maschoff Brennan

(57) ABSTRACT

A method includes: forming source/drain epitaxy structures over a semiconductor fin; forming a first ILD layer covering the source/drain epitaxy structures; forming a gate structure over the semiconductor fin and between the source/drain epitaxy structures; forming a capping layer over the gate structure; thinning the capping layer; forming a hard mask layer over the capping layer; forming a second ILD layer spanning the hard mask layer and the first ILD layer; forming, by using an etching operation, a contact hole passing through the first and second ILD layers to one of the source/drain epitaxy structures, the etching operation being performed such that the hard mask layer has a notched corner in the contact hole; filling the contact hole with a conductive material; and performing a CMP process on the conductive material until that the notched corner of the hard mask layer is removed.

20 Claims, 21 Drawing Sheets

Related U.S. Application Data

(60) Provisional application No. 62/565,885, filed on Sep. 29, 2017.

(51) Int. Cl.
| | | |
|---|---|---|
| *H01L 21/768* | (2006.01) |
| *H01L 29/417* | (2006.01) |
| *H01L 29/66* | (2006.01) |
| *H01L 29/165* | (2006.01) |
| *H01L 29/78* | (2006.01) |
| *H01L 29/08* | (2006.01) |

(52) U.S. Cl.
CPC .... *H01L 21/76877* (2013.01); *H01L 29/0847* (2013.01); *H01L 29/165* (2013.01); *H01L 29/41791* (2013.01); *H01L 29/66545* (2013.01); *H01L 29/66795* (2013.01); *H01L 29/7848* (2013.01)

(56) References Cited

U.S. PATENT DOCUMENTS

| | | | |
|---|---|---|---|
| 2017/0133274 A1* | 5/2017 | Lu | H01L 21/76897 |
| 2018/0047810 A1 | 2/2018 | Hsu | |
| 2018/0166571 A1* | 6/2018 | Liu | H01L 29/161 |
| 2018/0286749 A1 | 10/2018 | Zhang | |
| 2020/0365697 A1* | 11/2020 | Li | H01L 29/66545 |
| 2020/0365710 A1* | 11/2020 | Hsu | H01L 29/6656 |

* cited by examiner

MECHANISM FOR MANUFACTURING SEMICONDUCTOR DEVICE

PRIORITY CLAIM AND CROSS-REFERENCE

The present application is a continuation application of U.S. application Ser. No. 16/053,981, filed Aug. 3, 2018, now U.S. Pat. No. 10,510,555, issued Dec. 17, 2019, which claims priority to U.S. Provisional Application Ser. No. 62/565,885, filed Sep. 29, 2017, which is herein incorporated by reference in their entirety.

BACKGROUND

As semiconductor devices are scaled down to submicron dimensions, planarization technology becomes increasingly complicated, both during the fabrication of the device and for the formation of multi-level interconnects and wiring. Chemical-mechanical planarization (CMP) has recently emerged as a technique for achieving a high degree of planarization for submicron very large integrated circuit fabrication.

Furthermore, CMP is a widely used process by which both chemical and mechanical forces are used to globally planarize a semiconductor workpiece. The planarization prepares the workpiece for the formation of a subsequent layer. A CMP system includes a rotating platen covered by a polishing pad. A slurry distribution system is configured to provide a chemical mechanical polishing slurry to the polishing pad. A workpiece is then brought into contact with the pad, causing the rotating platen to planarize the workpiece.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-8A are perspective views of a local semiconductor device at various stages of fabrication in accordance with some embodiments of the present disclosure.

FIGS. 1B-8B are cross-sectional views taken along lines B-B in FIGS. 1A-8A respectively.

DETAILED DESCRIPTION

Figure 1A:
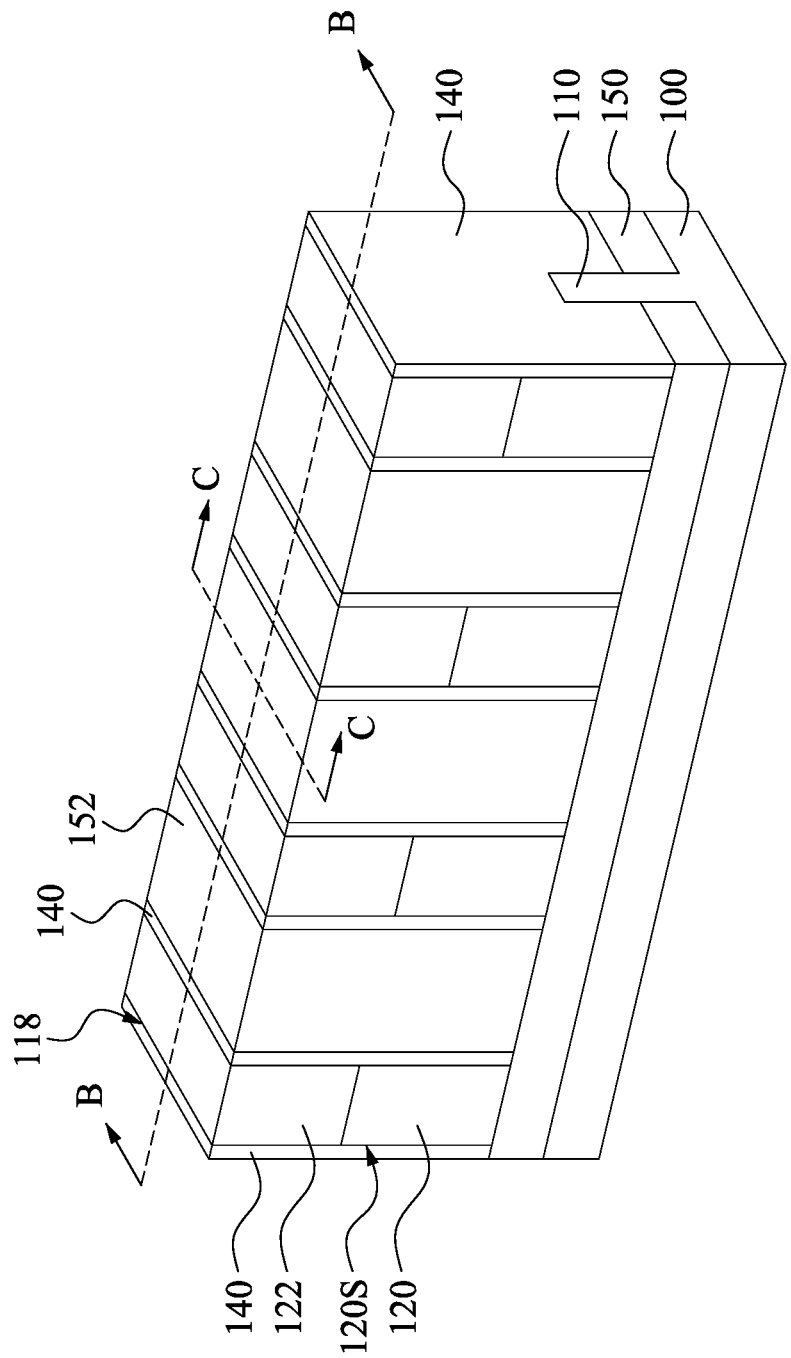

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terminology used herein is for the purpose of describing particular embodiments and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

FIGS. 1A-8A are perspective views of a local semiconductor device at various stages of fabrication in accordance with some embodiments of the present disclosure. FIGS. 1B-8B are cross-sectional views taken along lines B-B in FIGS. 1A-8A respectively.

Figure 1C:
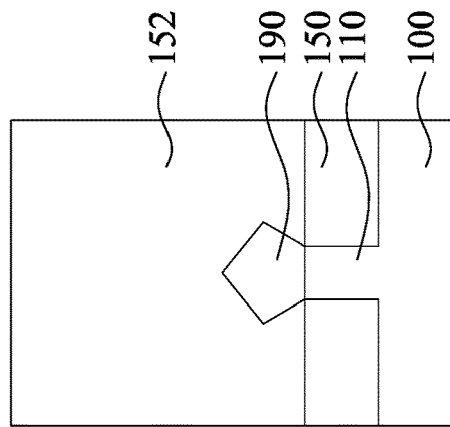
FIG. 1C is a cross-sectional view taken along line C-C in FIG. 1A.
Figure 1B:
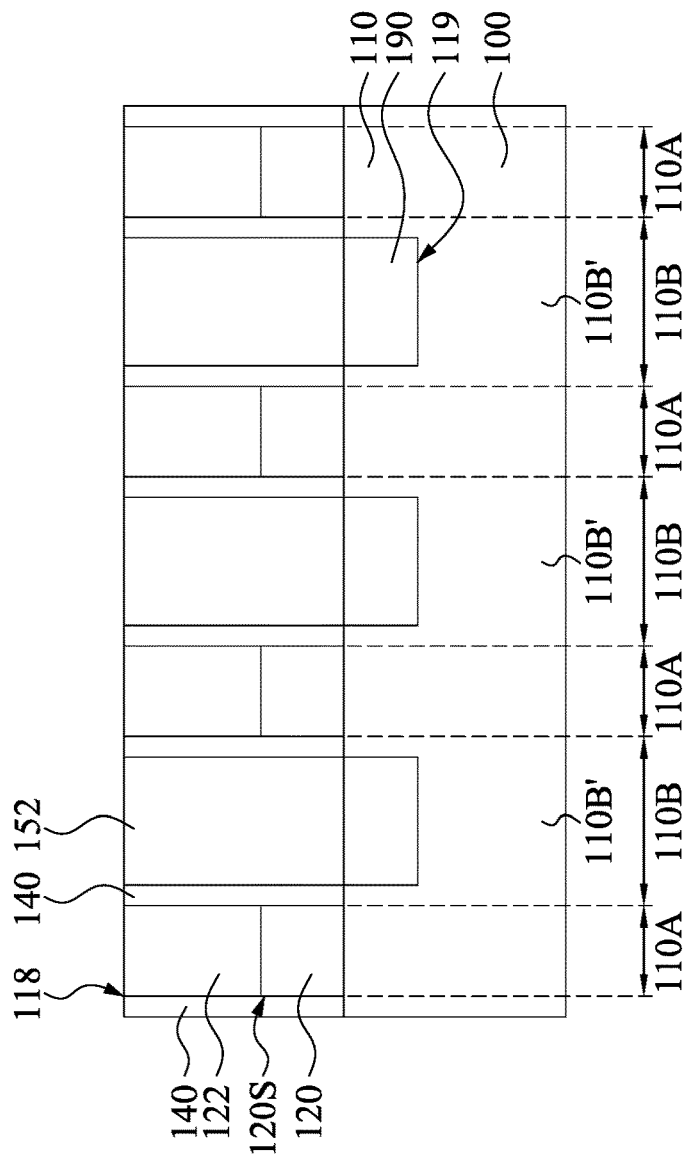

Reference is made to FIGS. 1A, 1B, and 1C. FIG. 1C is a cross-sectional view taken along line C-C in FIG. 1A. A substrate 100 is provided. The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. The SOI substrate is fabricated using separation by implantation of oxygen (SIMOX), wafer bonding, and/or other suitable methods.

Some exemplary substrates 100 also include an insulator layer. The insulator layer includes suitable materials such as silicon oxide, sapphire, and/or combinations thereof. An exemplary insulator layer may be a buried oxide layer (BOX). The insulator is formed by one or more suitable process(es), such as implantation (e.g., SIMOX), oxidation, deposition, and/or other suitable process. In some exemplary semiconductor substrates 100, the insulator layer is a component (e.g., layer) of a silicon-on-insulator substrate.

The substrate 100 may also include various doped regions. The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

In some embodiments, the substrate 100 also includes a fin structure 110. The fin structure 110 of the substrate 100 includes a plurality of channel portions 110A and a plurality of source/drain portions 110B adjacent to the channel portions 110A. The fin structure 110 may include Si, SiGe, or other suitable materials. In some embodiments, the fin structure 110 is formed by one or more suitable process(es) including various deposition, photolithography, and/or etching processes. As an example, the fin structure 110 is formed by patterning and etching a portion of the substrate 100. In some embodiments, a layer of photoresist material (not shown) is sequentially deposited over the substrate 100. The layer of photoresist material is irradiated (exposed) in accordance with a desired pattern (the fin structure 110 in this case) and developed to remove portions of the photoresist material. The remaining photoresist material protects the underlying material from subsequent processing operations, such as etching. It should be noted that other masks, such as an oxide or silicon nitride mask, may also be used in the etching process.

The fin structure 110 may be patterned by some other suitable methods. For example, the fin structure 110 may be patterned using one or more photolithography processes, including double-patterning or multi-patterning processes. Some of double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over the substrate 100 and patterned using a photolithography process. Spacers are formed alongside the patterned sacrificial layer using a self-aligned process. The sacrificial layer is then removed, and the remaining spacers may then be used to pattern the fin structure 110.

An isolation structure 150 is formed over the substrate 100 and adjacent to the fin structure 110. The isolation structure 150, which acts as a shallow trench isolation (STI) around the fin structure 110, may be formed by filling trenches within the fin structure 110 by insulator materials such as silicon oxide, silicon nitride, or silicon oxynitride, using chemical mechanical planarization (CMP) to remove the excessive insulator materials outside the trenches, and etching back the remaining insulator materials. In some other embodiments, the isolation structure 150 is an insulator layer of a SOI wafer.

A dummy gate structure (not shown) including a gate dielectric and a gate electrode over the gate dielectric is formed over the substrate 100. In some embodiments, in order to form the dummy gate structure, a gate dielectric layer is formed over the substrate 100, followed by a dummy gate electrode layer. The gate dielectric layer and the dummy gate electrode layer are then patterned, respectively forming the gate dielectric and the gate electrode. Hard masks may be formed on the dummy gate structure for process reasons, in which the hard masks may include silicon nitride. The channel portions 110A are covered by the dummy gate structure, and the source/drain portions 110B are uncovered by the dummy gate structure. In other words, the dummy gate structure is formed over the channel portions 110A of the fin structure 110 of the substrate 100.

A plurality of gate spacers 140 are formed respectively on opposite sidewalls of the dummy gate structure. In some embodiments, at least one of the gate spacers 140 includes single or multiple layers. The gate spacers 140 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, and other suitable methods. The gate spacers 140 may then be patterned, such as by one or more etch(es) to remove the portions of the dielectric layer(s) from the horizontal surfaces of the structure.

At least part of the source/drain portions 110B of the fin structure 110 of the substrate 100 are recessed to form a plurality of recesses 119 in the source/drain portions 110B of the fin structure 110 of the substrate 100. After the recessing process, the source/drain portions 110B respectively include recessed portions 110B'. The recessed portions 110B' of the source/drain portions 110B are adjacent to the channel portions 110A. The source/drain portions 110B of the fin structures 110 may be recessed by suitable process including dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

A plurality of epitaxy structures 190 are respectively formed in the recesses 119 and over the source/drain portions 110B of the fin structure 110. That is, the epitaxy structures 190 are formed respectively over the recessed portions 110B' of the source/drain portion 110B of the fin structure 110. The epitaxy structures 190 may be formed using one or more epitaxy or epitaxial (epi) processes, such that Si features, SiGe features, and/or other suitable features can be formed in a crystalline state on the fin structure 110. In some embodiments, lattice constants of the epitaxy structures 190 is different from lattice constants of the fin structure 110, and the epitaxy structures 190 is strained or stressed to enable carrier mobility of the semiconductor device and enhance the device performance.

In some embodiments, for a P-type transistor, the epitaxy structures 190 may include SiGe, Si, III-V compound semiconductor materials, or combinations thereof for p-type epitaxy structure. The epitaxy structures 190 may have facet surfaces for the p-type epitaxy structure. During the formation of the p-type epitaxy structure, p-type impurities may be doped with the proceeding of the epitaxy. In some other embodiments, for an N-type transistor, the epitaxy structures 190 may include SiP, SiC, SiPC, Si, III-V compound semiconductor materials, or combinations thereof for n-type epitaxy structure. The epitaxy structures 190 may have non-facet surfaces for the n-type epitaxy structure. During the formation of the n-type epitaxy structure, n-type impurities such as phosphorous or arsenic may be doped with the proceeding of the epitaxy. For example, when the epitaxy structures 190 include SiC or Si, n-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 110 (e.g., silicon). Thus, a strained channel can be achieved to increase carrier mobility and enhance device performance. The epitaxy structures 190 may be in-situ doped. If the epitaxy structures 190 are not in-situ doped, a second implantation process (i.e., a junction implant process) is performed to dope the epitaxy structures 190. One or more annealing processes may be performed to activate the epitaxy structures 190. The annealing processes include rapid thermal annealing (RTA) and/or laser annealing processes.

A first interlayer dielectric (ILD) layer 152 is formed over the substrate 100, in which the first ILD layer 152 is formed over the epitaxy structures 190. That is, the epitaxy structures 190 is covered and protected by the first ILD layer 152 during process(es) performed later. Moreover, the first ILD layer 152 is formed over the gate spacers 140 and the dummy gate structure. A chemical mechanical planarization (CMP) process is performed to remove portions of the first ILD layer 152. During the CMP process, the dummy gate structures are exposed. The remaining portions of the first ILD layer 152 cover the epitaxy structures 190, respectively. The first ILD layer 152 may include silicon oxide, oxynitride or other suitable materials.

A replacement gate (RPG) process scheme is employed. In the RPG process scheme, a dummy gate structures are formed in advance and is replaced by a metal gate. In some embodiments, the dummy gate structures (not shown) are removed to form a plurality of openings 118 between the gate spacers 140. The dummy gate structures may be removed by dry etch, wet etch, or a combination of dry and wet etch. For example, a wet etch process may include exposure to a hydroxide containing solution (e.g., ammonium hydroxide), deionized water, and/or other suitable etchant solutions. In some embodiments, the dummy gate structures provide a constraint force on the channel portion 110A of the fin structure 110. After the dummy gate structures are removed, the constraint force applied on the channel portion 110A of the fin structure 110 disappears accordingly, such that the in-plane tensile strain on the channel portions 110A of the fin structure 110, induced by the epitaxy structures 190, may be enhanced.

A plurality of gate electrodes 120 are formed in the openings 118 respectively. In other words, the dummy gate structures are replaced by the gate electrodes 120, such that the spacers 140 are disposed on sidewalls 120S of the gate electrode 120. The gate electrode 120 is formed over the channel portion 110A of the fin structure 110 of the substrate 100. The gate electrodes 120 may include a metal, metal alloy, and/or metal silicide. Additionally, the formation of the gate electrodes 120 may include depositions to form various gate materials, one or more liner layers, and one or more CMP processes to remove excessive gate materials and thereby planarize top surfaces of the gate electrodes 120.

In some other embodiments, a work function metal layer included in the gate electrodes 120 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process. In some embodiments, the gate electrodes 120 formed is a p-type metal gate including a p-type work function layer. In some embodiments, a capping layer included in the gate electrodes 120 may include refractory metals and their nitrides (e.g. TiN, TaN, W2N, TiSiN, TaSiN). The cap layer may be deposited by PVD, CVD, metal-organic chemical vapor deposition (MOCVD) and ALD. In some embodiments, a fill layer included in the gate electrodes 120 may include tungsten (W). The metal layer may be deposited by ALD, PVD, CVD, or other suitable process.

A removing process is performed to the gate electrodes 120 to partially remove the gate electrodes 120. The etching process(es) may include a wet etch, a dry etch, and/or a combination thereof. As an example, a wet etching solution may include $HNO_3$, $NH_4OH$, KOH, HF, HCl, NaOH, $H_3PO_4$, and/or other suitable wet etching solutions, and/or combinations thereof. Alternatively, a dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some embodiments, the etching process is chosen to selectively etch the gate electrodes 120 without substantially etching the first ILD layer 152 and the gate spacers 140. In some embodiments, the etching process is controlled such that top surfaces of the remaining the gate electrodes 120 are lower than the top surfaces of the first ILD layer 152 and the gate spacers 140. The term "substantially" as used herein may be applied to modify any quantitative representation which could permissibly vary without resulting in a change in the basic function to which it is related.

The dielectric layer 122 is formed over the substrate 100. The dielectric layer 122 covers the gate electrodes 120 and between the gate spacers 140. One or more CMP processes are performed to polish back the dielectric layer 122, such that the top surface of the first ILD layer 152 is exposed, and the remaining portions of the dielectric layer 122 are respectively in the opening 118. In some embodiments, the dielectric layer 122 may be a hard mask, and may include silicon nitride (SiN), silicon carbon nitride (SiCN), aluminium oxide (AlO), aluminium oxynitride (AlON), hafnium oxide (HfO), or zirconium (ZrO), $HfO_2$, $ZrO_2$, $HfZrO_x$, $HfSiO_x$, HfSiON, $ZrSiO_x$, $HfZrSiO_x$, $Al_2O_3$, $HfAlO_x$, HfAlN, $ZrAlO_x$, $La_2O_3$, $TiO_2$, $Yb_2O_3$, $Y_2O_3$, $Ta_2O_5$, other suitable materials, or combinations thereof. The dielectric layer 122 may include a material which is different from the first ILD layer 152, the gate spacers 140, and the epitaxy structures 190 to achieve etching selectivity during etching processes performed later.

Figure 2A:
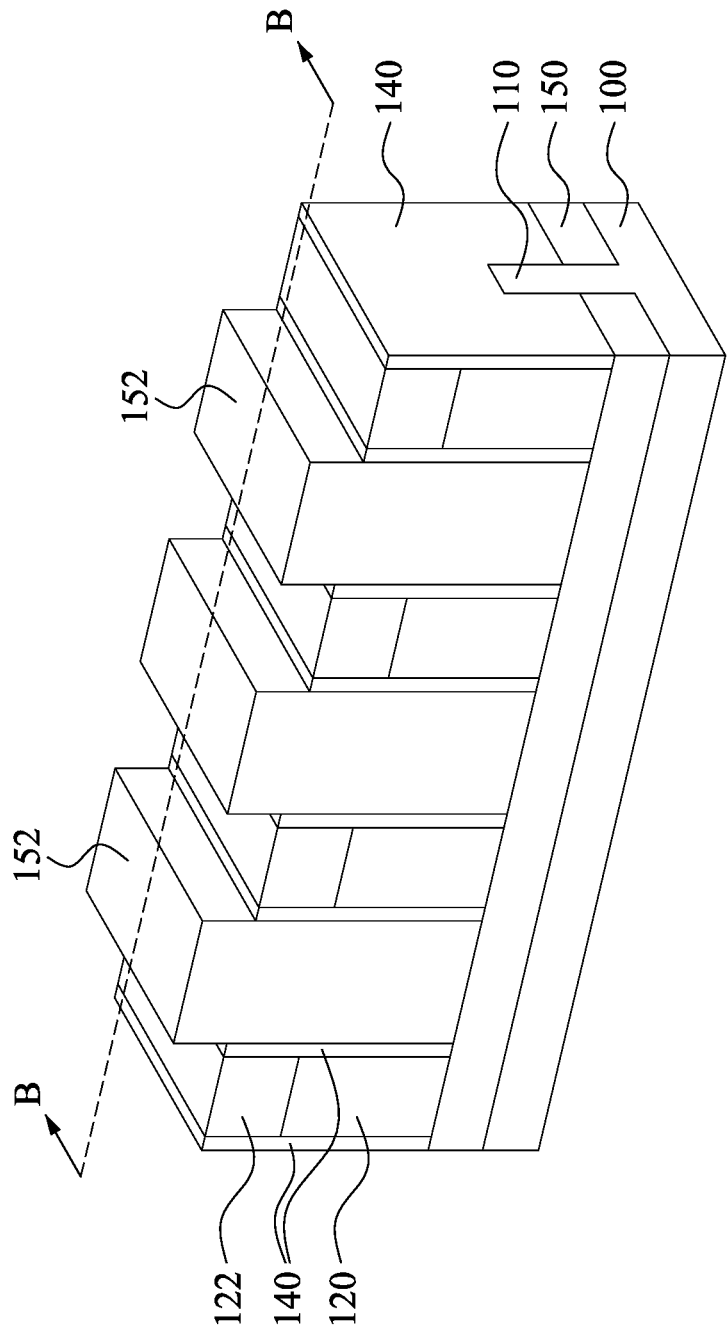
Figure 2B:
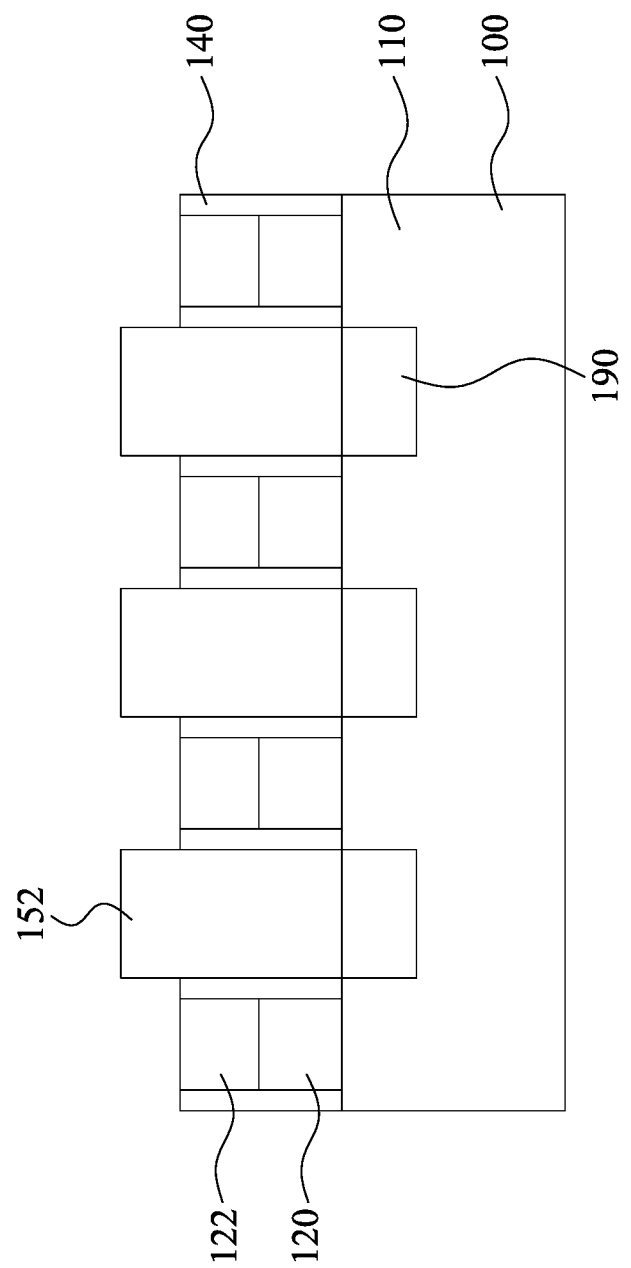

Reference is made to FIGS. 2A and 2B. A removing process is performed to the dielectric layer 122 and the gate spacers 140 to partially remove the dielectric layer 122 and the gate spacers 140. The etching process(es) may include a wet etch, a dry etch, and/or a combination thereof. In some embodiments, the etching process is chosen to selectively etch the dielectric layer 122 and the gate spacers 140 without substantially etching the first ILD layer 152. In some embodiments, the etching process is controlled such that top surfaces of the remaining the dielectric layer 122 and the gate spacers 140 are substantially coplanar and lower than the top surfaces of the first ILD layer 152.

Figure 3A:
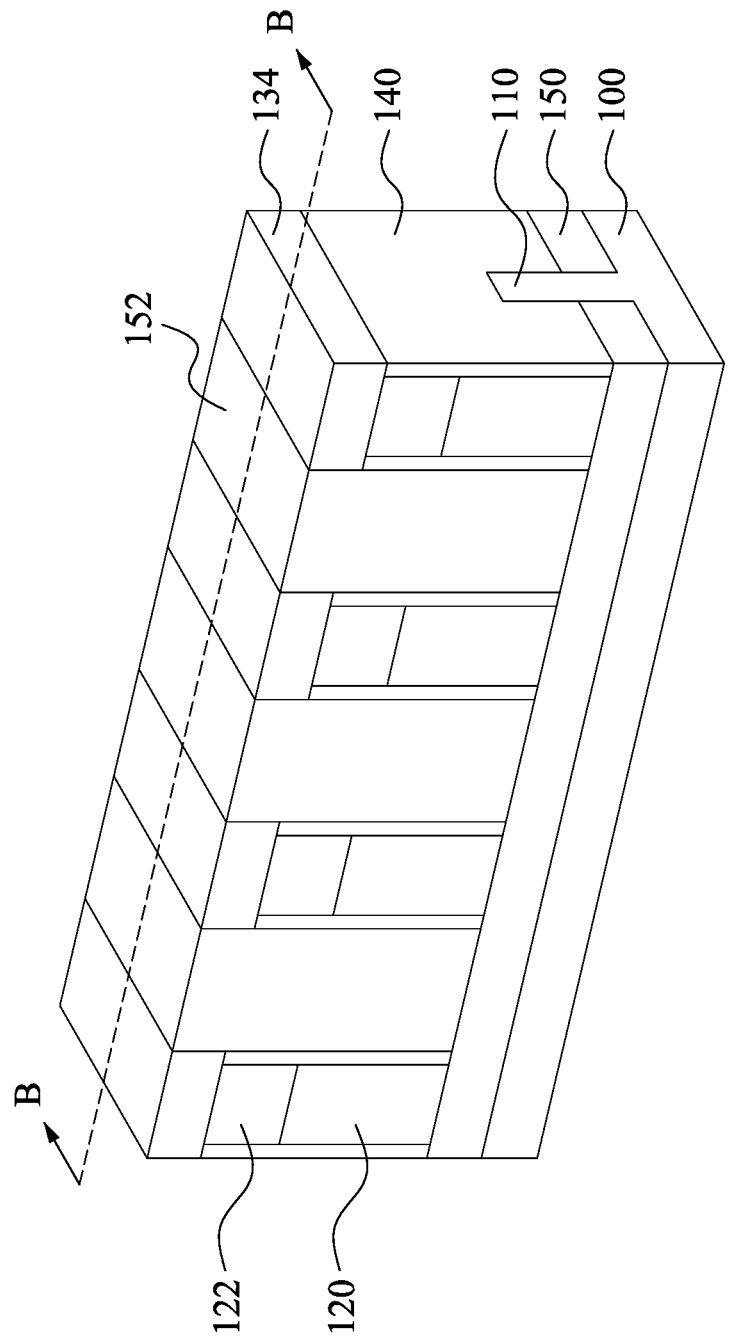
Figure 3B:
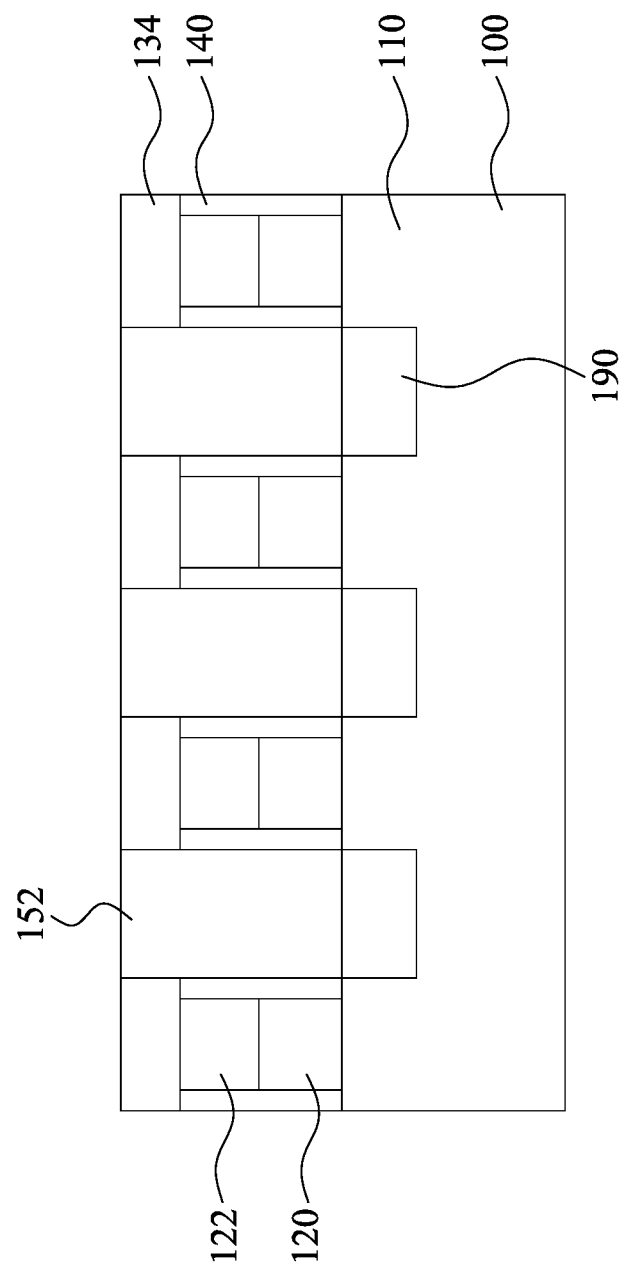

Reference is made to FIGS. 3A and 3B. A hard mask 134 is formed over the substrate 100. The hard mask 134 covers the dielectric layer 122 and the gate spacers 140. One or more CMP processes are performed to polish back the hard mask 134, such that the top surface of the first ILD layer 152 is exposed. In some embodiments, the hard mask 134 includes metal oxide, such as transitional metal oxide. In some embodiments, the hard mask 134 may include, for example, $HfO_2$, $ZrO_2$, $HfZrO_x$, $HfSiO_x$, HfSiON, $ZrSiO_x$, $HfZrSiO_x$, $Al_2O_3$, $HfAlO_x$, HfAlN, $ZrAlO_x$, $La_2O_3$, $TiO_2$, $Yb_2O_3$, $Y_2O_3$, $Ta_2O_5$, or combinations thereof. The hard mask 134 may include a material which is different from the first ILD layer 152 and the epitaxy structures 190 to achieve etching selectivity during etching processes performed later. In some embodiments, the dielectric layer 122 is made of material that is the same as the hard mask 134. In some other embodiments, the dielectric layer 122 can be omitted, such that the hard mask 134 is over and in contact with the gate electrode 120 and the gate spacers 140.

Figure 4A:
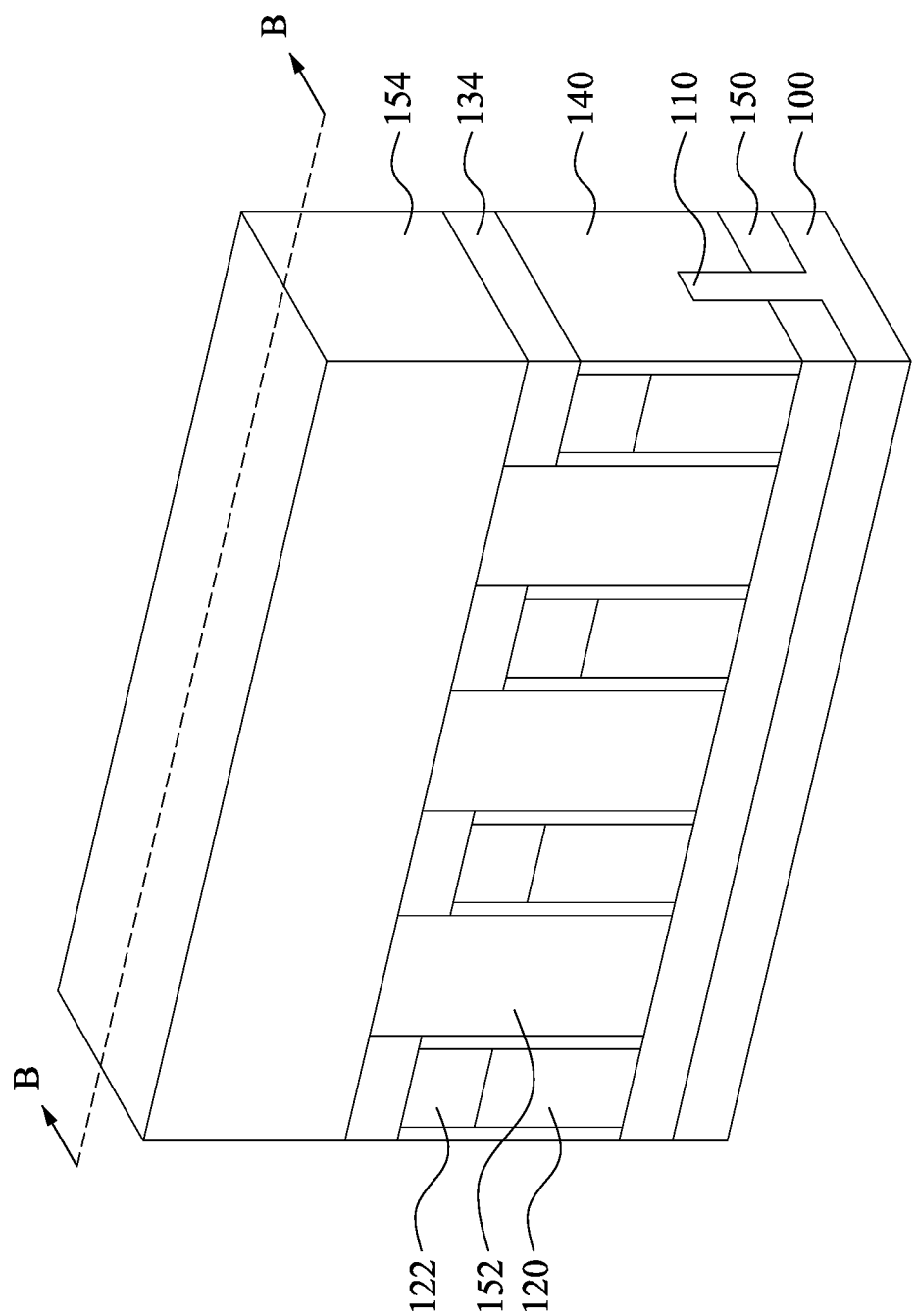
Figure 4B:
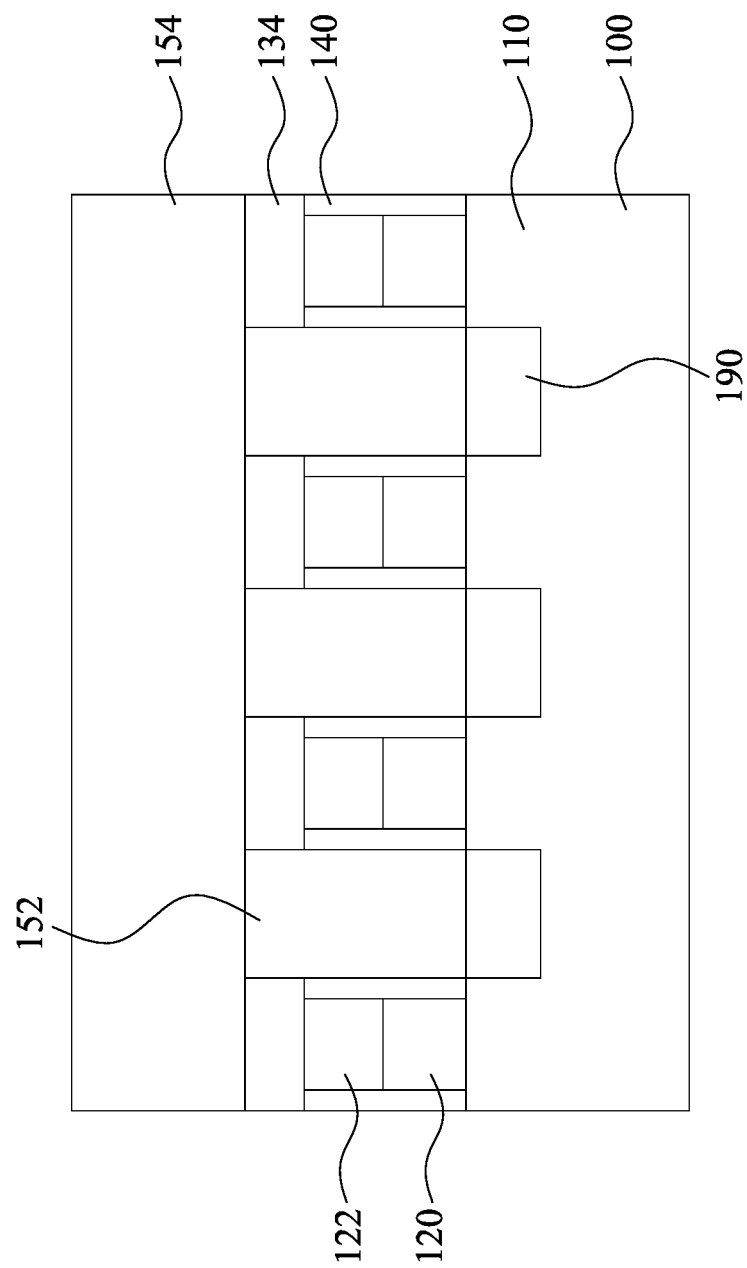

Reference is made to FIGS. 4A and 4B. After the forming of the hard mask 134, a second ILD layer 154 is formed over the substrate 100 and in contact with the hard mask 134 and the first ILD layer 152. The second ILD layer 154 may include silicon oxide, oxynitride or other suitable materials.

Figure 5A:
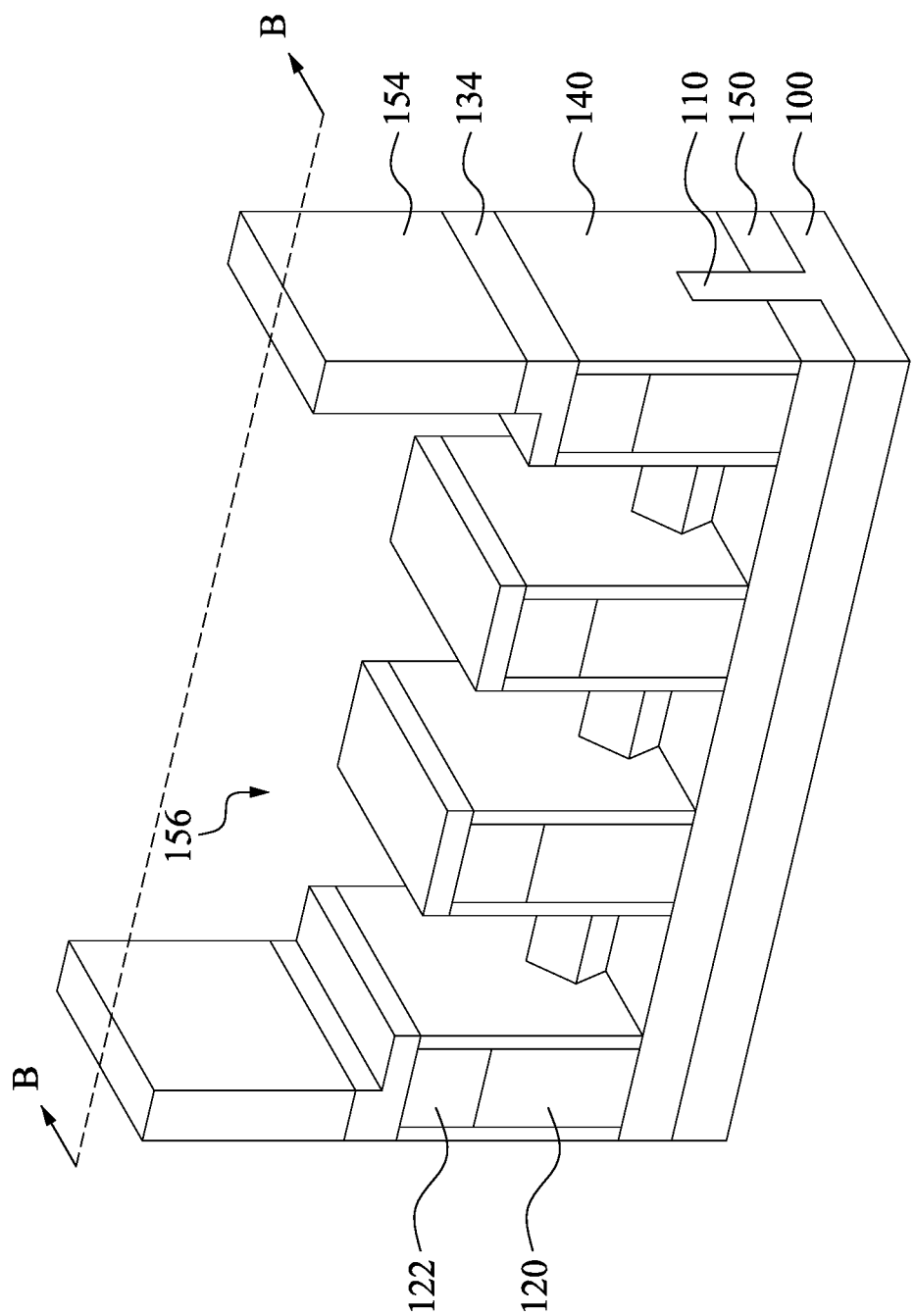
Figure 5B:
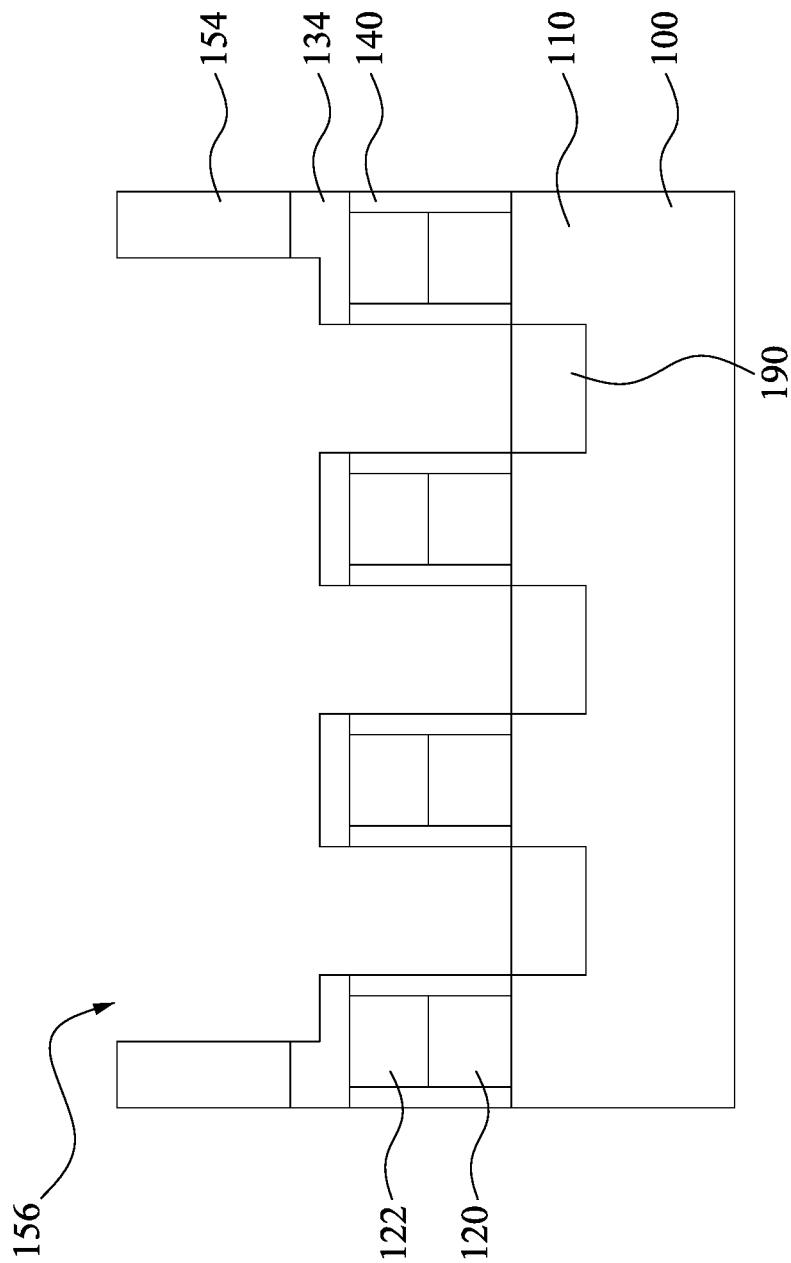

Reference is made to FIGS. 5A and 5B. After the forming of the second ILD layer 154, a recessing process is performed to the first ILD layer 152 and the second ILD layer 154 to form a contact hole 156 that expose the hard masks 134, the epitaxy structures 190, and the isolation structure 150. In some embodiments, during the recessing process, portions of the hard masks 134 are removed, such that a thickness of some of the hard masks 134 is reduced.

Figure 6A:
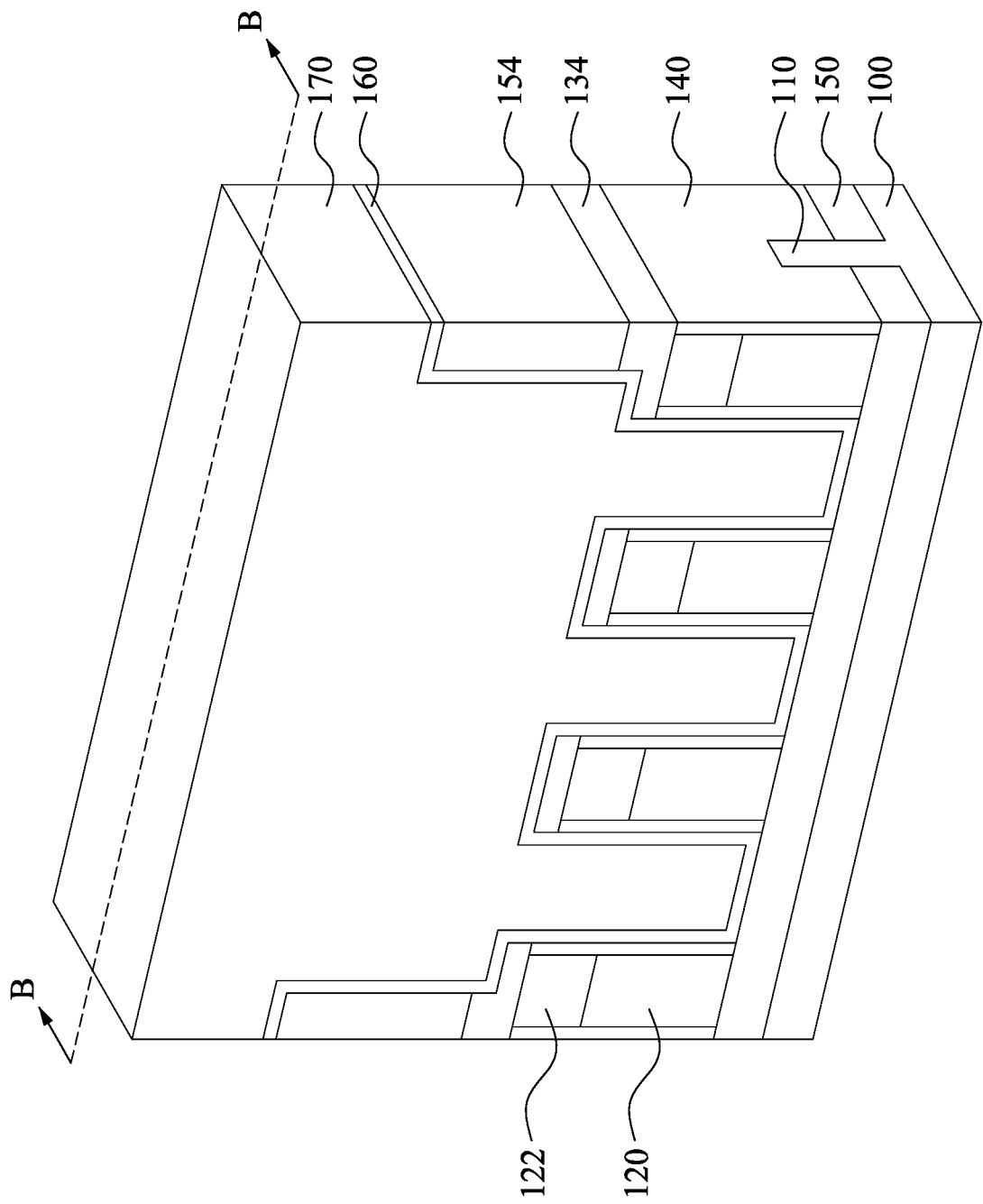
Figure 6B:
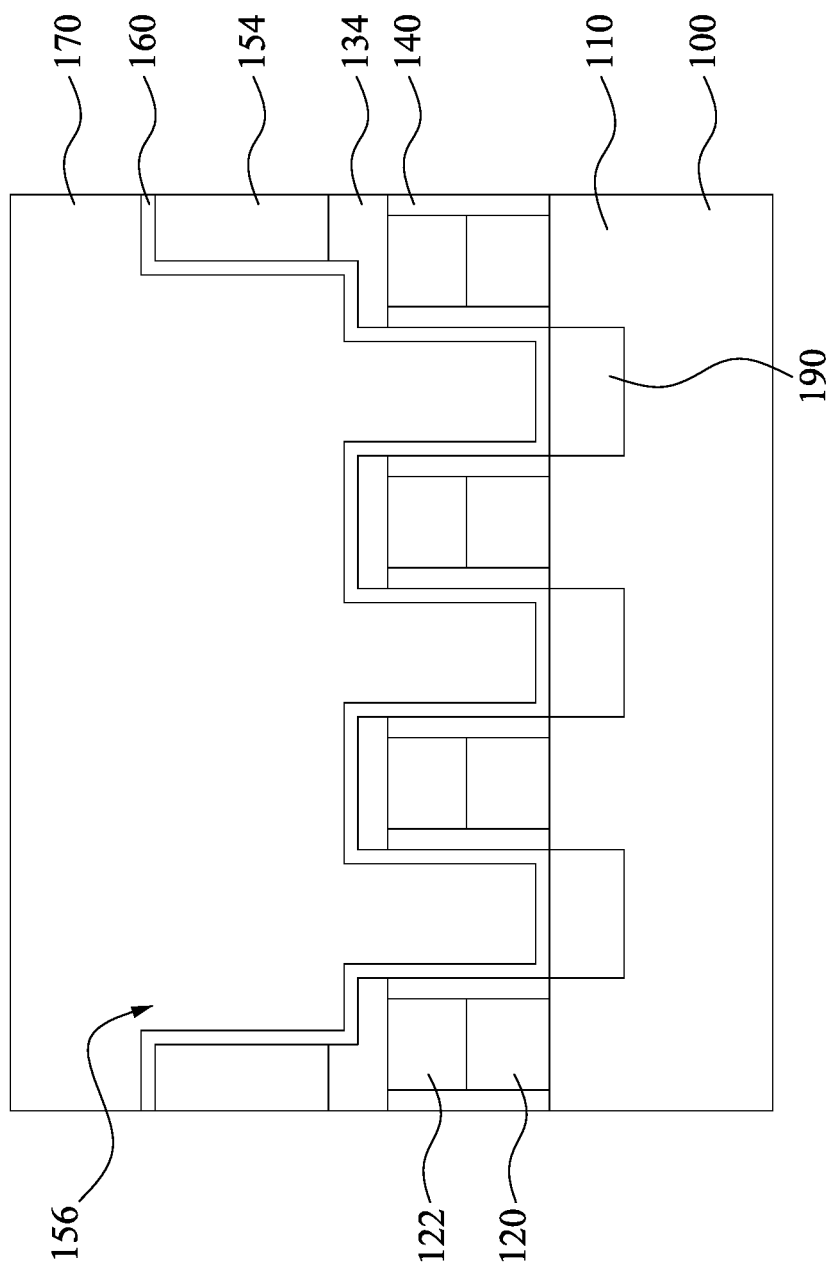

Reference is made to FIGS. 6A and 6B. The contact hole 156 is filled with at least a conductive material to form source/drain contacts in the hard masks 134 and second ILD layer 154. Specifically, a barrier layer 160 is conformally formed in the contact hole 156, and a conductive material 170 is deposited over the barrier layer 160 and filled in the contact hole 156. Further, the conductive material 170 and the barrier layer 160 cover up at least portions of the epitaxy structures 190, the gate spacers 140, and the hard masks 134. In some embodiments, the barrier layer 160 is made of, such as, Ti, TiN, Ta, TaN, some other suitable materials, or combinations thereof. In some embodiments, the conductive material 170 is made of, such as, W, Co, Ru, Cu, or combinations thereof.

Figure 7A:
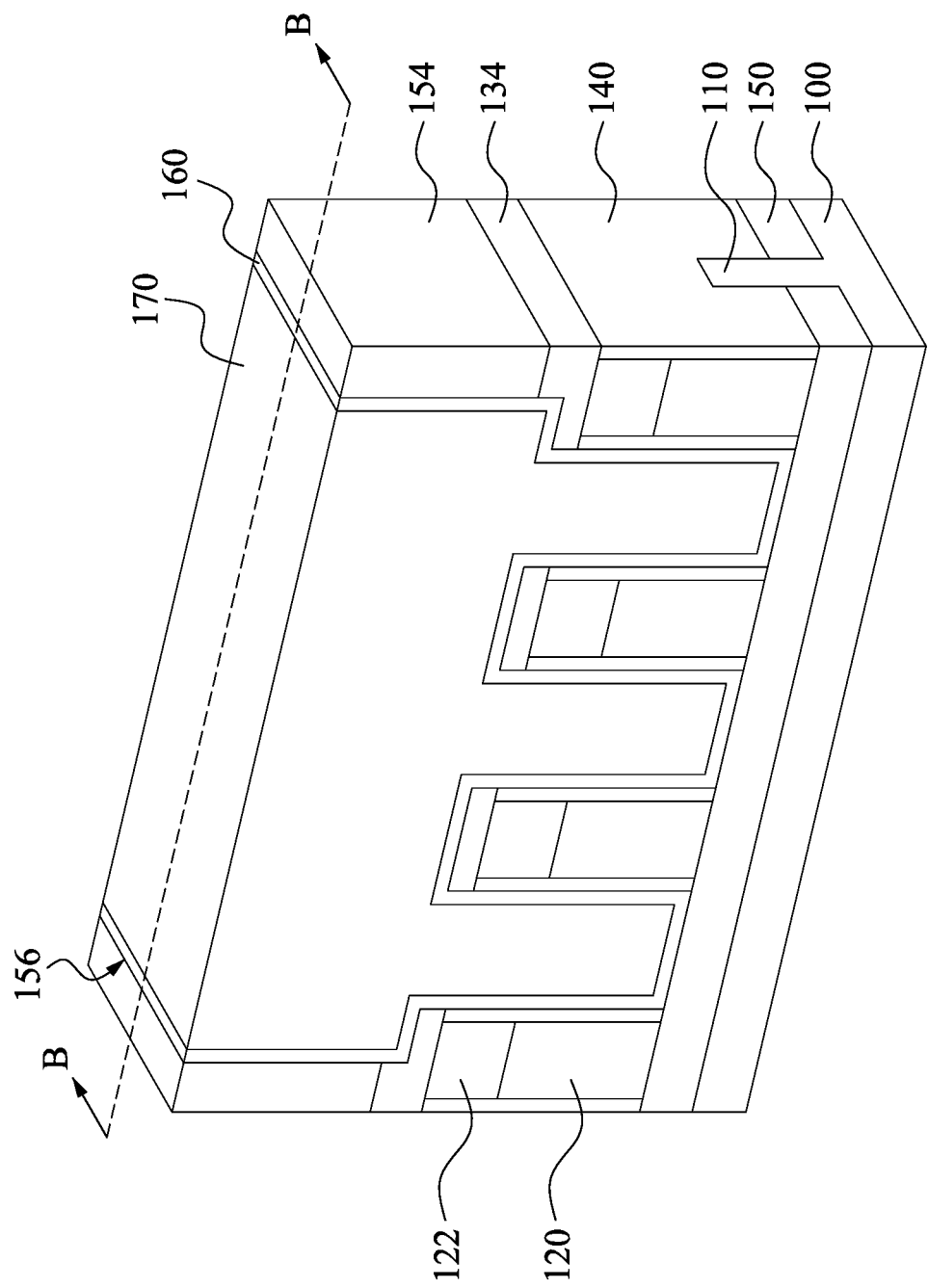
Figure 7B:
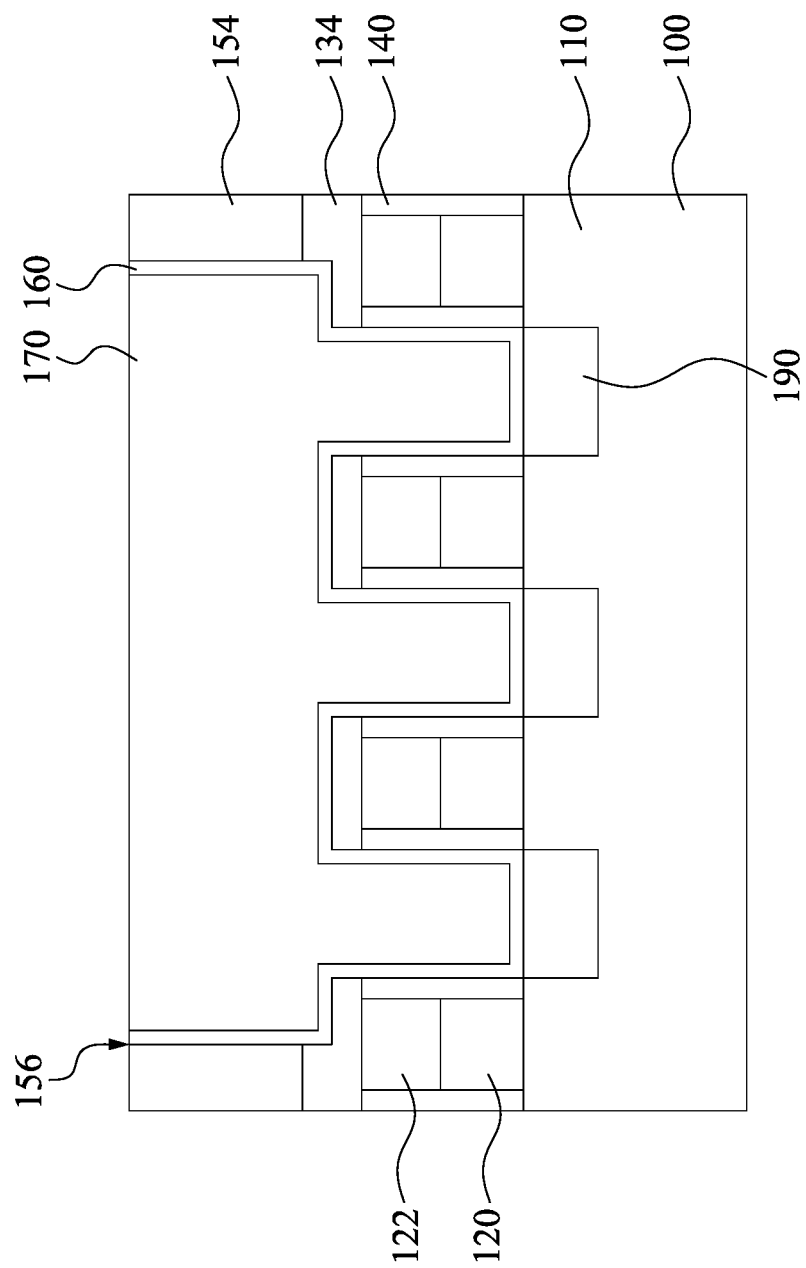

Reference is made to FIGS. 7A and 7B. After the filling of the conductive material (i.e., the conductive material 170 and the barrier layer 160 in FIGS. 6A and 6B), a CMP process is performed to remove the excess portion of the conductive material outside the contact hole 156, and the remaining conductive material in the contact hole 156 forms contact plug. The contact plug includes the remaining barrier layer 160 and the remaining conductive material 170.

Figure 8A:
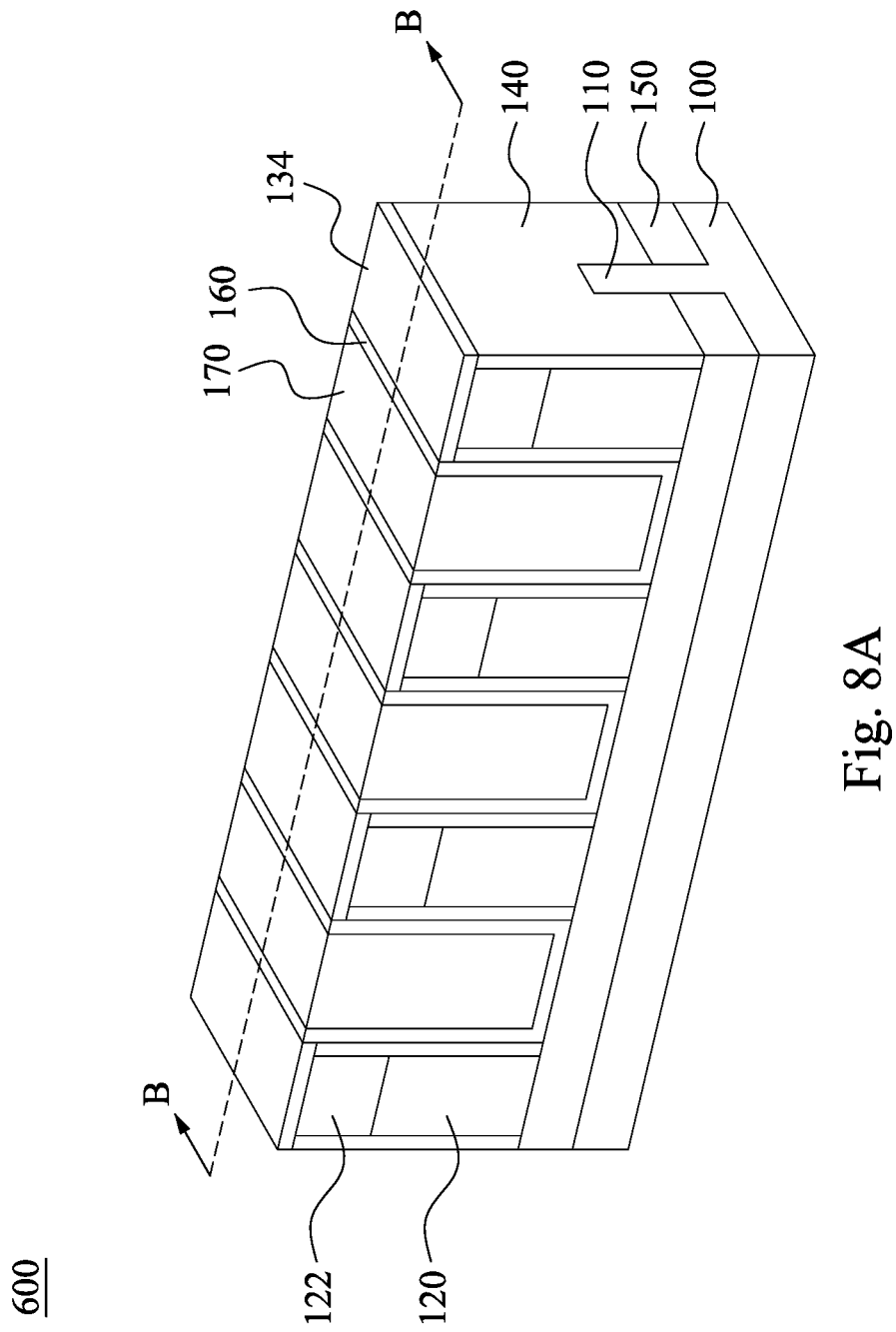
Figure 8B:
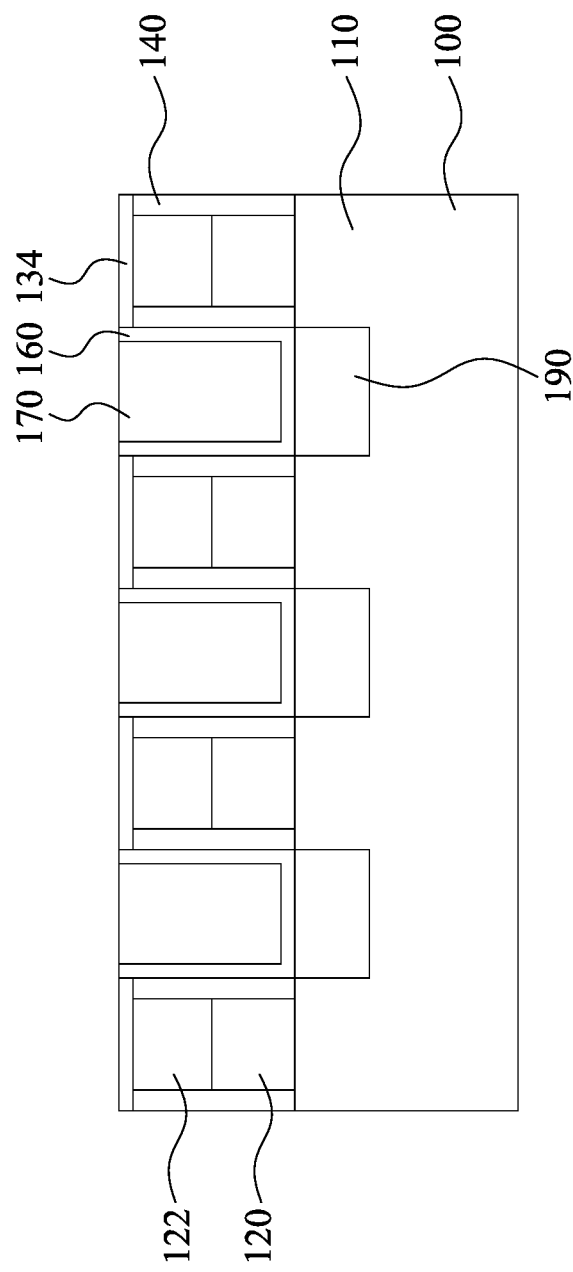

Reference is made to FIGS. 8A and 8B. The second ILD layer 154 and excess portions of the first ILD layer 152, the barrier layer 160, and the conductive material 170 over the hard mask 134 are removed using a chemical mechanical polishing (CMP) process. In some embodiments, the CMP process uses slurry containing a metal oxide removal rate (RR) suppressor. The metal oxide RR suppressor ensures a low metal oxide removal rate. Accordingly, after the CMP process, loss of the hard mask 134 can be minimized. Specifically, the CMP process stops at the hard mask 134. The CMP process has a removal rate of the second ILD layer 154, and a removal rate of the hard mask 134. In some embodiments, a ratio of the removal rate of the second ILD layer 154 to the removal rate of the hard mask 134 is greater than about 5. If the ratio of the removal rate of the second ILD layer 154 to the removal rate of the hard mask 134 is less than about 5, the CMP process would significantly consume the hard mask 134, and thus the hard mask 134 after the CMP process would be too thin to protect the underlying gate electrodes 120 in the subsequent process, which in turn adversely affects the performance of the semiconductor device.

In some embodiments, the CMP process has a removal rate of the conductive material 170, and a ratio of the removal rate of the conductive material 170 to the removal rate of the hard mask 134 is greater than about 5. Similarly, if the ratio of the removal rate of the conductive material 170 to the removal rate of the hard mask 134 is less than about 5, the CMP process would significantly consume the hard mask 134, and thus the hard mask 134 after the CMP process would be too thin to protect the underlying gate electrodes 120 in the subsequent process, which in turn adversely affects the performance of the semiconductor device.

In some embodiments, the removal rate of the hard mask 134 is less than about 20 Å/min. Similarly, if the removal rate of the hard mask 134 is greater than about 20 Å/min, the CMP process would significantly consume the hard mask 134, and thus the hard mask 134 after the CMP process would be too thin to protect the underlying gate electrodes 120 in the subsequent process, which in turn adversely affects the performance of the semiconductor device.

In some embodiments, the hard mask 134 has a first thickness prior to the CMP process and a second thickness after the CMP process. A difference between the first thickness and the second thickness is less than about 10 nm. In some embodiments, the first thickness of the hard mask 134 prior to the CMP process is about 22 nm, and the second thickness of the hard mask 134 after the CMP process is greater than about 12 nm. In some embodiments, the second thickness of the hard mask 134 is able to be greater than about 10 nm after the CMP process.

For example, if the second thickness of the hard mask 134 is less than about 10 nm, the difference between the first thickness and the second thickness is greater than about 10 nm, and/or a ratio of the first thickness to the second thickness of is greater than about 1.8, and then after the CMP process, the hard mask 134 may be too thin to protect the dielectric layer 122 and the gate electrodes 120 underneath in the subsequent process, which in turn adversely affects the performance of the semiconductor device. As a result, if the second thickness of the hard mask 134 is greater than about 10 nm, the difference between the first thickness and the second thickness is less than about 10 nm, and/or the ratio of the first thickness to the second thickness of the hard mask 134 is less than about 1.8, and then after the CMP process, loss of the hard mask 134 can be minimized to ensure that the hard mask 134 has enough thickness to protect the dielectric layer 122 and the gate electrodes 120 underneath in the subsequent process. Furthermore, the second thickness of the hard mask is able to be greater than about 10 nm prior to and after the CMP process.

Figure 9:
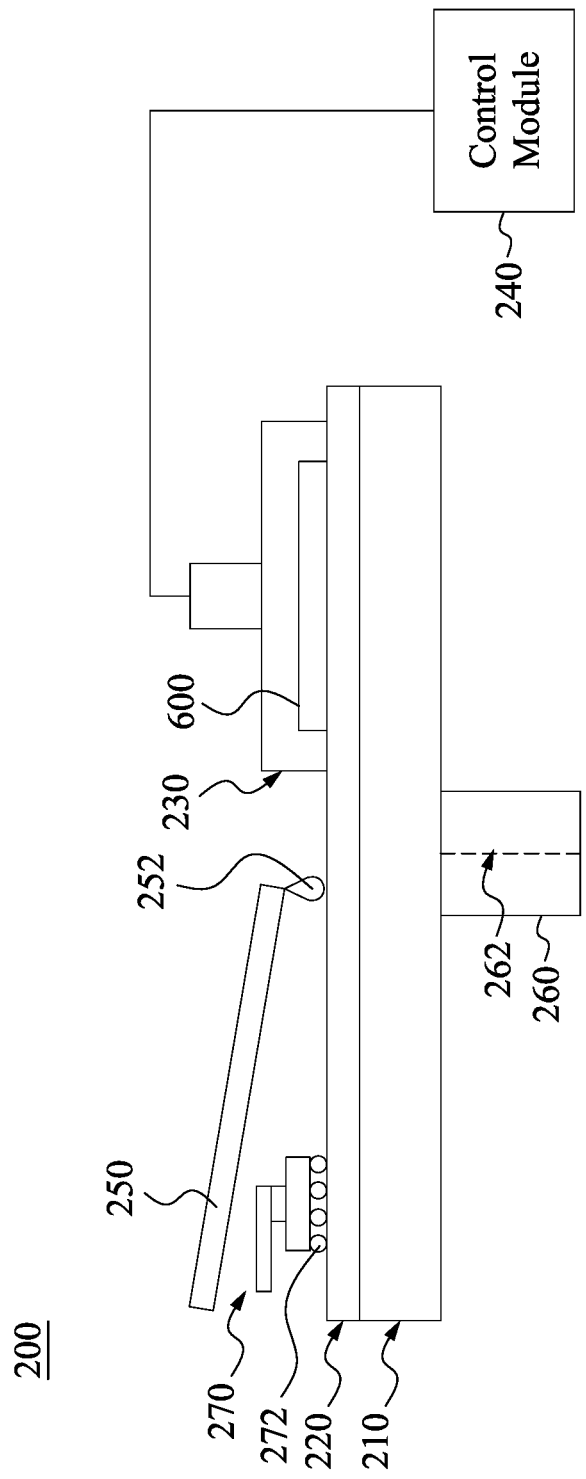
FIG. 9 is a schematic view of a chemical-mechanical planarization (CMP) system and a wafer according to some embodiments of this disclosure.

Reference is made to FIG. 9. FIG. 9 is a schematic view of a chemical-mechanical planarization (CMP) system 200 used to perform the CMP process according to some embodiments of this disclosure. As shown in FIG. 9, the CMP system 200 includes a platen 210, a pad 220, a polish head 230, a control module 240, a slurry introduction mechanism 250, a rotating mechanism 260, and a pad conditioning element 270. The pad 220 is disposed on the platen 210. The rotating mechanism 260 rotates the platen 210 and the pad 220 and/or the polish head 230 about an axis of rotation 262 during operation of the CMP system 200. The polish head 230 holds the wafer 600 including the semiconductor device against the pad 220 and is configured to house the wafer 600 in an upside down position so that a top surface of the wafer 600 faces the pad 220. The polish head 230 is operable to bring the wafer 600 into contact with the pad 220. By bringing the wafer 600 into contact with the pad 220, polishing of the wafer 600 is performed.

As shown in FIG. 9, the pad conditioning element 270 includes a diamond grit conditioning pad 272 and is configured to push on the pad 220 with a downward force that brings the plurality of diamond particles into contact with the pad 220. As the pad 220 is rotated by the platen 210, the diamond particles removes the accumulated debris and byproduct during the CMP process and also (re-) makes the pad 220 surface rough. In some embodiments, the CMP system 200 has a downforce in a range from about 0.5 psi to about 2.5 psi, in which the downforce controls the removal rate during the CMP process. For example, if the downforce is lower than 0.5 psi, the downforce would lead to insufficient RR. Further, if the downforce is higher than 2.5 psi, the downforce would worsen RR profile and/or bring about defects such as scratch, dishing, erosion. As a result, if the downforce is in a range from about 0.5 psi to about 2.5 psi, the downforce would provide sufficient RR and reduce the defects with the slurry containing the metal oxide removal rate (RR) suppressor adding therein.

The slurry introduction mechanism 250 introduces the slurry 252 onto the pad 220. The slurry 252 contains a metal oxide RR suppressor. The metal oxide RR suppressor is configured to reduce the removal rate of the metal oxide layer, such as hard mask 134, ensures a low metal oxide removal rate and thus reduces the loss of the metal oxide layer during the CMP process. In some embodiments, the removal rate of the metal oxide layer, such as the hard mask 134, in the slurry 252 is less than the removal rate of the dielectric layer, such as the first ILD layer 152, in the slurry 252. For example, the removal rate of the metal oxide layer, such as hard mask 134, during the rotation is reduced from about 50 A/min to about 19 A/min. The metal oxide RR suppressor may include, for example, a boric acid or derivatives of the boric acid, such as, 3-aminophenylboronic acid, thiophene-2-carboxylic acid methyl ester-5-boric acid, phenylboronic acid, trimethyl borate, triisopropyl borate, triethyl borate, lithoum metaborate, triphenyl borate, tributyl borate, sodium metaborate tetrahydrate, tetrahydroxydiboron, 4-methoxyphenylboronic acid, 2-methoxyphenylboronic acid, 4-fluorophenylboronic acid, 4-(dimethylamino) phenylboronic acid, 3-aminophenylboronic acid hemisulfate salt, trimethoxyboroxine, triethanolamine borate, tri-tert-butyl borate, cyclopropylboronic acid, tris-borate-EDTA buffer, metaboric acid, or combinations thereof. In some embodiments, a concentration of the metal oxide RR suppressor in the slurry 252 is less than about 500 mM. For example, if the concentration of the metal oxide RR suppressor in the slurry 252 is greater than 500 mM, the boric acid may be in the form of dimer, trimer and/or poly-borate polymers instead of the adsorption on the hard mask 134 via monomer (see FIGS. 10A and 10B). As a result, if the concentration of the metal oxide RR suppressor in the slurry 252 is less than 500 mM, the boric acid may be in a form of monomer to adsorb on the hard mask 134 to enhance a zeta potential of a surface of the hard mask 134.

Figure 10B:
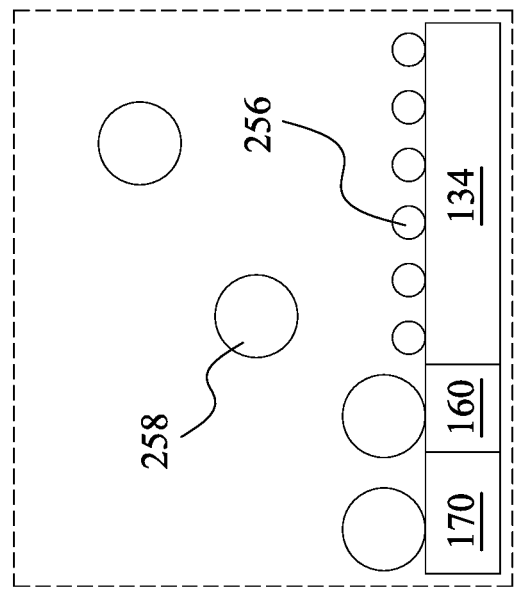
FIG. 10B is a schematic view of a mechanism between the hard mask, a barrier layer, a conductive material, the metal oxide RR suppressor, and the abrasive particles according to some embodiments of this disclosure.
Figure 10A:
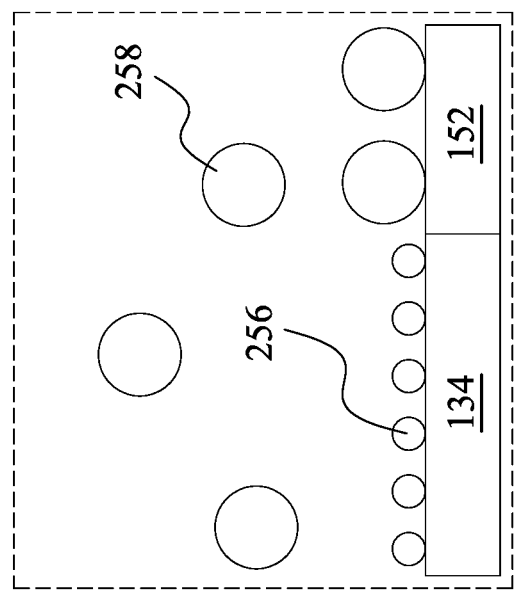
FIG. 10A is a schematic view of a mechanism between a hard mask, a first interlayer dielectric (ILD) layer, a metal oxide removal rate (RR) suppressor, and a plurality of abrasive particles according to some embodiments of this disclosure.

Reference is made to FIGS. 10A and 10B. FIG. 10A is a schematic view of a mechanism between the hard mask 134, the first ILD layer 152, the metal oxide RR suppressor 256, and the abrasive particles 258 according to some embodiments of this disclosure. FIG. 10B is a schematic view of a mechanism between the hard mask 134, the barrier layer 160, the conductive material 170, the metal oxide RR suppressor 256, and the abrasive particles 258 according to some embodiments of this disclosure.

As shown in FIGS. 10A and 10B, the metal oxide RR suppressor 256 selectively absorbs on a surface of the hard mask 134, which includes, for example, metal oxide such as $ZrO_2$, rather than the first ILD layer 152 (shown in FIG. 10A), the conductive material 170, and the barrier layer 160 (shown in FIG. 10B), so as to enhance the zeta potential of the surface of the hard mask 134. Hence, a surface zeta potential of the hard mask 134 is greater than a surface zeta potential of the first ILD layer 152 during the planarization process, such as CMP process. Alternatively, a surface zeta potential of the hard mask 134 is greater than a surface zeta potential of the conductive material 170 (and/or the barrier layer 160) during the planarization process. For example, the reactivity of the surface of the hard mask 134 can exposes both cation sites and anion sites. The cation sites of the hard mask 134 act as Lewis acids attracting the oxygen atoms of the adsorbate, such as the boric acid, while the surface anion sites of the hard mask 134 (oxygen, in this case) act as Lewis bases attracting hydrogen atoms of the adsorbate, such as the boric acid. Thus, the strength of this Lewis acid-base pair determines the dissociation of the boric acid molecule.

Furthermore, the bonding mechanism of the boric acid molecule with the hard mask 134 including transition-metal atom can be understood from the hybridization of the boric acid molecule states with the d orbitals ($t_{2g}$ and $e_g$ states) of the metal atom in the relevant energy range. In this regard, the interaction of empty $e_g$ states with the boric acid leads to adsorbate-adsorbent bonds, while the interaction of filled $t_{2g}$ states contributes to the reduction of the intramolecular O—H bond strength of the boric acid molecule, favoring dissociation. Another factor that contributes to dissociation is the Lewis base strength of the surface O atom, which can be determined from the surface states of O atoms of the hard mask 134. The projected density of states (PDOS) before and after adsorption, taking into account the most stable molecular and dissociative adsorption configurations of the boric acid on the hard mask 134. In the case of molecular adsorption of the boric acid on hard mask 134, upon dissociative adsorption, the $t_{2g}$ orbitals interact strongly and are pushed downward in energy, favoring dissociative adsorption. As mentioned earlier, another factor determining dissociation of the boric acid is the surface O states of the hard mask 134. The Lewis acid strength of the exposed hard mask 134 oxygen atoms leads to a greater driving force for dissociative adsorption. These O states of the hard mask 134 interact strongly with protons, upon dissociation of the boric acid.

More specifically, there is a number of adsorption structures for the metal oxide RR suppressor 256 (such as, $B(OH)_3$) on the hard mask 134 (such as, $ZrO_2$). For example, there are five oxygen atoms exposed between the $B(OH)_3$ and the $ZrO_2$, which leads to a wide variety of possible adsorption configurations.

The molecular adsorption is favorable in both the hydrogen-bonded monodentate, $Zr_3$—(OH)B(OH)(OH) . . . $O_5$, and the bidentate, 2-(OH)B(OH)(HO)—$Zr_3$, configurations. The monodentate trans form is stable with an adsorption energy of −1.06 eV, whereas the bidentatecis form has an adsorption energy of −0.50 eV. All the energy values are referenced to the initial reactants, the $ZrO_2$+ trans-$B(OH)_3$ system. Then, the dissociation of $B(OH)_3$ is probable, resulting in the stable single O—H dissociated bidendate structure, $Zr_2$—OB(OH)(HO)—$Zr_3$+$O_5$—H, with an adsorption energy of −1.61 eV. Then, Further dissociation of $B(OH)_3$ is also observed to be favorable. The double O—H dissociated bidentate structure $Zr_2$—OB(OH)O—$Zr_3$+$O_5$—H+$O_6$—H have an adsorption energy of −1.49 eV. Water elimination reactions are favorable on the $ZrO_2$ surface. One of these structures, $Zr_3$—OB($O_5$)—(OH)+$H_2O$, a bidentate with one of the 0 atoms bonded to a surface Zr atom and the B atom bonded to a surface O atom, is likely to form. The adsorption energy of this structure is found to be −0.66 eV. In summary, $B(OH)_3$ dissociatively adsorbs onto the $ZrO_2$ surface and that the bidentate single and double O—H dissociated structures are likely to be formed.

After the adsorption of the boric acid on the hard mask 134, the boric acid provides an electrostatic repulsion between the hard mask 134 and the abrasive particles 258. Hence, the abrasive particles 258 repulse away from the hard mask 134 due to the boric acid absorbing thereon, thereby reducing the metal oxide removal rate during the CMP process. As such, the hard mask 134 can be preserved as an etching hard mask for the following process operations. That is, the boric acid selectively protects the hard mask 134 during the CMP process. The hard mask 134 also acts as a CMP stop layer, and a reduction in gate height loss can be achieved. On the other hand, the reduction of the metal oxide removal rate leads to a higher removal rate on a $SiO_2$/metal CMP process due to the abrasive particles 258 being repulsed away from the hard mask 134 to at least portions of the $SiO_2$/metal.

Furthermore, the interaction of the hard mask 134 with the metal oxide RR suppressor 256, such as the boric acid, is strongly influenced by a pH value of the buffering solution 254. For example, when the concentration of the boric acid increases, the zeta potential increases, and the isoelectric point shifts toward lower pH value. In some embodiments, the buffering solution 254 (shown in FIGS. 11A and 11B) is controlled the pH value of the slurry 252 in a range from about 6 to about 10 in which an adsorption between the boric acid and the hard mask 134 shows a bell-shaped pH envelope, with a maximum adsorption at the pH value near the pKa of boric acid equal to 9.2 (e.g. $B(OH)_3$+$OH^-$↔ $B(OH)_4^-$, pKa=9.2). In other words, if the pH value of the slurry 252 is out of the range from about 6 to about 10, the adsorption between the boric acid and the hard mask 134 will be decreased and the enhanced zeta potential on the hard mask 134 will be decreased, such that the hard mask 134 cannot act as the CMP stop layer and be remained as the etching hard mask for the following process operations. Therefore, the pH of the slurry 252 is controlled in a range from about 6 to about 10 for improving the performance of the metal oxide RR suppressor to minimize the metal oxide removal rate.

In some embodiments, the hard mask 134 is made by $ZrO_2$, an adsorption between the boric acid and $ZrO_2$ leads to removal rates of a $SiO_2$/$ZrO_2$ and a metal/$ZrO_2$ are about 11 respectively during the $SiO_2$/metal CMP process. In some embodiments, when removal rates of the $SiO_2$/$ZrO_2$ and the metal/$ZrO_2$ are about 10 respectively, the metal oxide removal rate can be less than 20 A/min under a downward force of the CMP system 200 equal to or less than 1.5 psi.

In some embodiments, a removal rate ratio between the second interlayer dielectric (ILD) layer 154 (which includes, for example, $SiO_2$) and the hard mask, (which includes, for example, metal oxide ($MeO_x$)) is substantially equal to or larger than about 5, and a removal rate ratio between metal and $MeO_x$ is substantially equal to or larger than about 5 (metal/$MeO_x$) as well. In some embodiments, the loss of the hard mask 134 is less than or substantially equal to 10 nm during the $SiO_2$/metal CMP process.

Figure 11A:
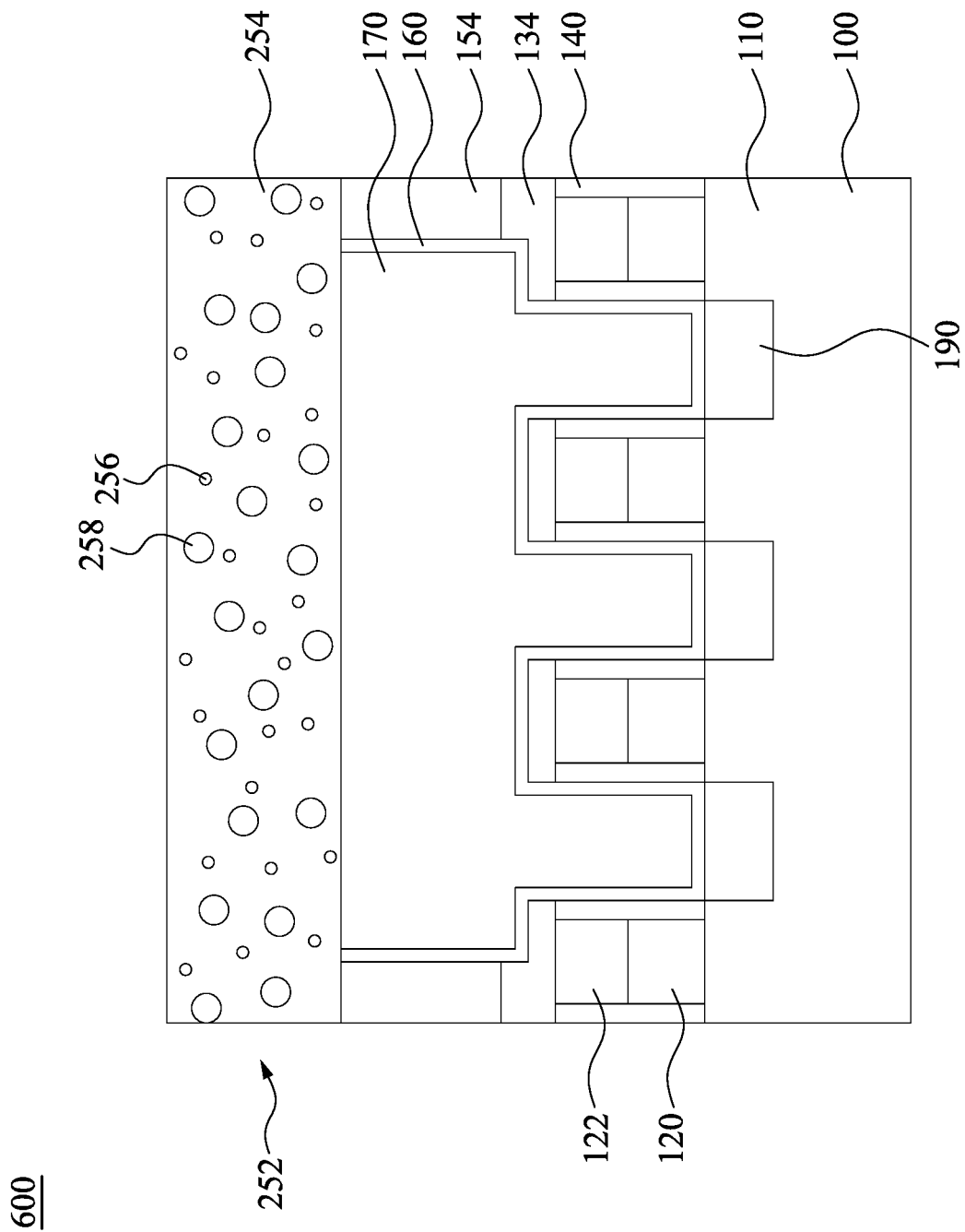
FIGS. 11A and 11B are schematic cross-sectional views of the wafer during the CMP process shown in FIGS. 7B and 8B.
Figure 11B:
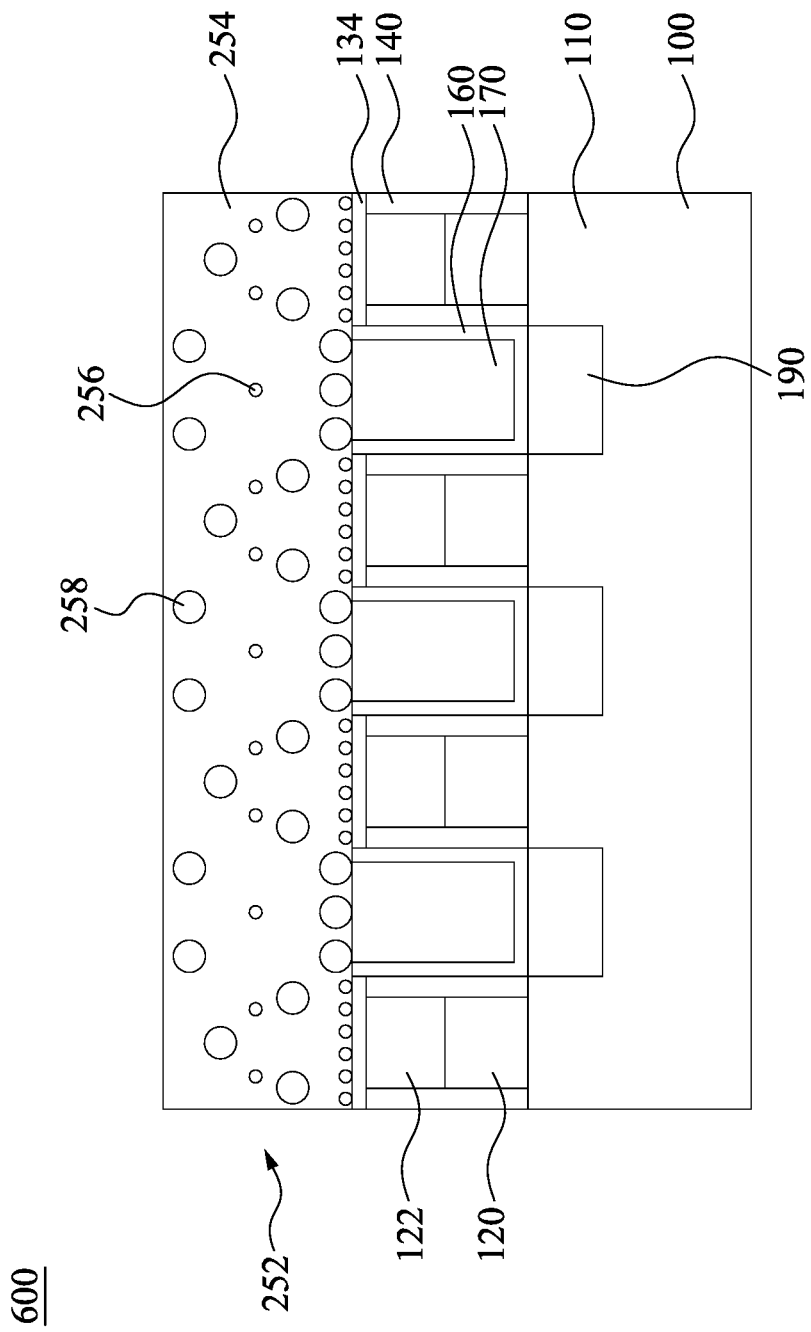

FIGS. 11A and 11B are schematic cross-sectional views of a wafer 600 during the CMP process shown in FIGS. 6B and 7B. Reference is made to FIGS. 10A to 11B. The slurry 252 includes a buffering solution 254, the metal oxide RR suppressor 256, and a plurality of abrasive particles 258 in the buffering solution 254. The buffering solution 254 may further include a metal oxide removal rate suppressor, an oxidizer, a chelating agent, a buffering agent, a metal removal rate (RR) enhancer, a barrier removal rate (RR) enhancer, and/or a metal corrosion inhibitor (not shown).

The buffering solution 254 is configured to sustain a pH value of the slurry 252 in a range from about 6 to about 10. In some embodiments, the abrasive particles 258 include $SiO_2$, $CeO_2$, $TiO_2$, $Al_2O_3$, $ZrO_2$, or combinations thereof. The oxidizer includes $HNO_3$, $H_2O_2$, $Fe(NO_3)_3$, $KMnO_4$, $K_2Cr_2O_7$, $KIO_3$, or combinations thereof. The chelating agent includes organic acid (R—COOH), such as, amino acid ($H_2NCHRCOOH$), ammonia ($NH_4OH$), or combinations thereof. The metal RR enhancer and the barrier RR enhancer may include organic acid (R—COOH), such as, a citric acid, an amino acid, or combinations thereof. The metal corrosion inhibitor includes benzotriazole (BTA), 5-aminotetrazole monohydrate (ATA), 5-phenyl-1H-tetrazole (PTA), 1-phenyl-1H-tetrazole-5-thiol (PTT), or combinations thereof. The buffering agent includes a citric acid, an acetic acid, monopotassium phosphate ($KH_2PO_4$), or combinations thereof.

As shown in FIG. 11A, the slurry 252 is introduced to be in contact with surfaces of the second ILD layer 154, the barrier layer 160, and the conductive material 170 facing away from the substrate 100. When the CMP system 200 (shown in FIG. 9) is actuated to polish the wafer 600, the abrasive particles 258 in the buffering solution 254 polish the second ILD layer 154, the barrier layer 160, and the conductive material 170 to remove at least portions of the second ILD layer 154, the barrier layer 160, and the conductive material 170. At this moment, the metal oxide RR suppressor 256 has no selectively adsorption on the second ILD layer 154, the barrier layer 160, and the conductive material 170. That is, the second ILD layer 154, the barrier layer 160, and the conductive material 170 substantially have the same removal rate for each other under the CMP process.

As shown in FIG. 11B, when the second ILD layer 154 and excess portions of the first ILD layer 152, the barrier layer 160, and the conductive material 170 are removed by the CMP process, and the hard mask 134 is exposed, the metal oxide RR suppressor 256 selectively absorbs on the surface of the hard mask 134 rather than on the conductive material 170, the barrier layer 160, so as to enhance the zeta potential of the surface of the hard mask 134. As a result, the metal oxide RR suppressor 256, such as, the boric acid, absorbing on the hard mask 134 provides the electrostatic repulsion between the hard mask 134 and the abrasive particles 258. Hence, the abrasive particles 258 repulse away from the hard mask 134, thereby reducing the metal oxide removal rate during the CMP process. Specifically, the slurry 252 of the present disclosure is used as a $SiO_2$/metal CMP slurry which ensures the low metal oxide removal rate to achieve the removal rate of the $SiO_2/MeO_x$ and the metal/$MeO_x$ substantially equal to or larger than 5 respectively. In some embodiments, the loss of the hard mask 134 is less than or substantially equal to 10 nm during the $SiO_2$/metal CMP process, which represents that the loss of the hard mask 134 can be minimized and can be stable during the CMP process, as shown in the following tables 1 and 2.

Table 1 is experimental results of removal rate and/or removal rate ratio among the hard mask, the barrier layer, the conductive material, and the second ILD layer during the CMP process which the slurry therein containing the metal oxide RR suppressor, such as, boric acid, and an additional metal RR enhancer. In table 1, the CMP process is performed on 200 mm wafer, and the PH value of the slurry thereof is substantially equal to 9. In addition, the hard mask was made of $ZrO_2$, the barrier layer and the conductive material were made of metal, and the second ILD layer was made of $SiO_2$. In this case, the $ZrO_2$ RR, $SiO_2$ RR, metal RR, $SiO_2/ZrO_2$ RR ratio, and metal/$ZrO_2$ RR ratio are all normalized by the case without having boric acid and the additional metal RR enhancer under the CMP process.

TABLE 1

Times of the removing rate (RR) and the RR ratio among the $ZrO_2$, $SiO_2$, and metal compared to the slurry without having boric acid under the CMP process

| Boric acid normalized amount | Normalized $ZrO_2$ RR | Normalized $SiO_2$ RR | Normalized Metal RR | Normalized $SiO_2/ZrO_2$ RR ratio | Normalized Metal/$ZrO_2$ RR ratio |
|---|---|---|---|---|---|
| 1 | 0.68 | 0.98 | 2.49 | 1.42 | 3.88 |
| 2.5 | 0.48 | 0.89 | 2.46 | 1.89 | 5.11 |
| 5 | 0.38 | 0.91 | 2.49 | 2.42 | 6.59 |

Table 2 is experimental results of removal rate and/or removal rate ratio among the hard mask, the barrier layer, the conductive material, and the second ILD layer during the CMP process which the slurry therein containing the metal oxide RR suppressor to various of down forces (DF) of the CMP process. In table 2, the CMP process is performed on 300 mm wafer, and the PH value of the slurry thereof is substantially equal to 9.5. In addition, the hard mask was made of $ZrO_2$, the barrier layer and the conductive material were made of metal, and the second ILD layer was made of $SiO_2$. In this case, the DF substantially equal to 3 psi is normalized to be 1, and the corresponding $ZrO_2$ RR, $SiO_2$ RR, metal RR, $SiO_2/ZrO_2$ RR ratio, and metal/$ZrO_2$ RR ratio are all normalized to be 1 under the normalized DF of the CMP process.

TABLE 2

Times of the removing rate (RR) and the RR ratio among the
$ZrO_2$, $SiO_2$, and metal with various down forces (DF)

| Normalized DF | Normalized $ZrO_2$ RR | Normalized $SiO_2$ RR | Normalized metal RR | Normalized $SiO_2/ZrO_2$ RR ratio | Normalized metal/$ZrO_2$ RR ratio |
|---|---|---|---|---|---|
| 0.72 | 0.73 | 0.73 | 0.75 | 1.01 | 1.04 |
| 0.53 | 0.55 | 0.56 | 0.59 | 1.01 | 1.09 |
| 0.34 | 0.36 | 0.38 | 0.43 | 1.04 | 1.17 |
| 0.17 | 0.20 | 0.22 | 0.28 | 1.09 | 1.39 |

Figure 12:
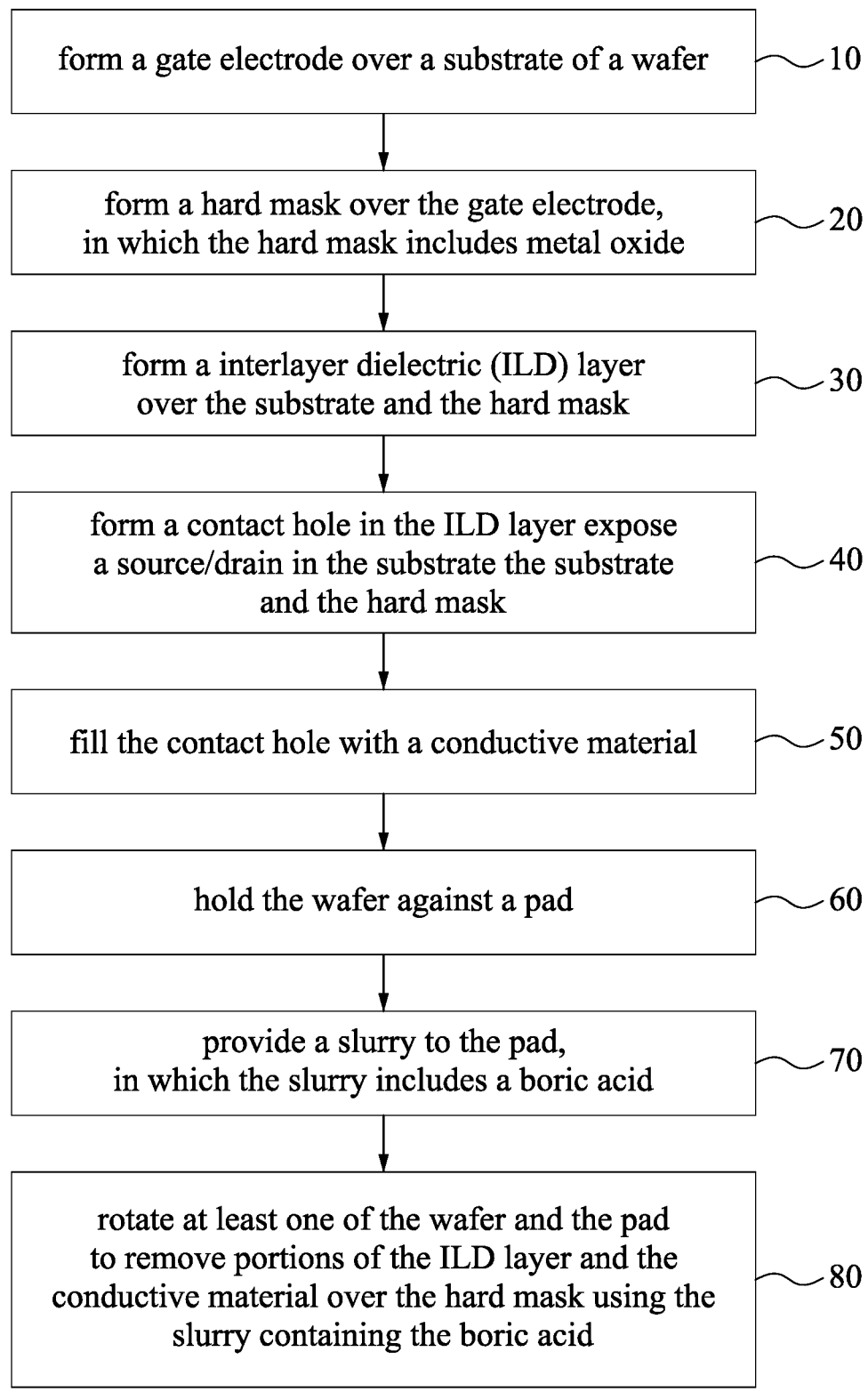
FIG. 12 is a flowchart of a method for polishing the wafer according to some embodiments of this disclosure.

Reference is made to FIG. 12. FIG. 12 is a flowchart of a method for polishing the wafer 600 according to some embodiments of this disclosure. As shown in FIGS. 8A-12, the method for polishing the wafer 600 includes the following operations. A gate electrode 120 is formed over a substrate 100 of the wafer 600 (operation 10). A hard mask 134, e.g. the metal oxide layer, is formed over the gate electrode 120 (operation 20), in which the hard mask 134 includes metal oxide. A second interlayer dielectric (ILD) layer 154, e.g. the ILD layer, is formed over the substrate 100 and the hard mask 134 (operation 30). A contact hole 156 is formed in the first and second ILD layers 152 and 154, e.g. the ILD layer, (operation 40) to expose at least one epitaxy structures 190 in the substrate 100. A conductive material 170, e.g. the conductor, is filled in the contact hole 156 (operation 50). The wafer 600 is held against the pad 220 (operation 60). A slurry 252 is provided to the pad 220 (operation 70), in which the slurry 252 includes a metal oxide RR suppressor 256, such as, a boric acid. At least one of the wafer 600 and the pad 220 is rotated to remove the dielectric layer 154, the barrier layer 160, and the conductor material 170 over the hard mask 134 (operation 80).

With such configuration, the metal oxide RR suppressor, such as, the boric acid (B(OH)$_3$, or its derivatives) selectively absorbs on the surface of the hard mask, such as MeO$_x$, rather than on the conductive material, the barrier layer, and the first ILD layer, so as to enhance the zeta potential of the surface of the hard mask. After the adsorption of the boric acid on the hard mask, the boric acid provides the electrostatic repulsion between the hard mask and the abrasive particles. Hence, the abrasive particles repulse away from the hard mask due to the boric acid absorbing thereon, thereby reducing the metal oxide removal rate during the CMP process. As such, the hard mask can be preserved as an etch hard mask for the following process operations. That is, the boric acid selectively protects the hard mask during the CMP process. In addition, the hard mask also acts as a CMP stop layer, and a reduction in gate height loss can be achieved.

In some embodiments, a method for manufacturing a semiconductor device includes forming a gate electrode over a substrate; forming a hard mask over the gate electrode, in which the hard mask includes a metal oxide; forming an interlayer dielectric (ILD) layer over the hard mask; forming a contact hole in the ILD layer, in which the contact hole exposes a source/drain; filling the contact hole with a conductive material; and applying a chemical mechanical polish process to the ILD layer and the conductive material, in which the chemical mechanical polish process stops at the hard mask, the chemical mechanical polish process uses a slurry containing a boric acid or its derivative, the chemical mechanical polish process has a first removal rate of the ILD layer and a second removal rate of the hard mask, and a first ratio of the first removal rate of the ILD layer to the second removal rate of the hard mask is greater than about 5.

In some embodiments, the hard mask has a first thickness prior to the chemical mechanical polish process and a second thickness after the chemical mechanical polish process. A difference between the first thickness and the second thickness is less than about 10 nm.

In some embodiments, the chemical mechanical polish process has a third removal rate of the conductive material. The third removal rate of the conductive material is greater than the second removal rate of the hard mask.

In some embodiments, the chemical mechanical polish process has a third removal rate of the conductive material. A second ratio of the third removal rate of the conductive material to the second removal rate of the hard mask is greater than about 5.

In some embodiments, a pH value of the slurry is in a range from about 6 to about 10.

In some embodiments, a concentration of the boric acid in the slurry is less than about 500 mM.

In some embodiments, the slurry includes an organic acid.

In some embodiments, the metal oxide is $HfO_2$, $ZrO_2$, $Y_2O_3$, $TiO_2$, $Al_2O_3$, $Ta_2O_5$, $La_2O_3$, or combinations thereof.

In some embodiments, the boric acid is in a form of monomer.

In some embodiments, a surface zeta potential of the hard mask is greater than a surface zeta potential of the ILD layer during the chemical mechanical polish process.

In some embodiments, a method for manufacturing a semiconductor device includes forming a gate electrode over a substrate; forming a hard mask over the gate electrode, in which the hard mask includes a metal oxide; forming an interlayer dielectric (ILD) layer over the hard mask; forming a contact hole in the ILD layer, in which the contact hole exposes a source/drain; filling the contact hole with a conductive material; and applying a chemical mechanical polish process to the ILD layer and the conductive material, in which the chemical mechanical polish process stops at the hard mask, the chemical mechanical polish process uses a slurry containing a boric acid or its derivative, the chemical mechanical polish process has a first removal rate of the conductive material and a second removal rate of the hard mask, and a ratio of the first removal rate of the conductive material to the second removal rate of the hard mask is greater than about 5.

In some embodiments, a surface zeta potential of the hard mask is greater than a surface zeta potential of the conductive material during the chemical mechanical polish process.

In some embodiments, the hard mask has a first thickness prior to the chemical mechanical polish process and a second thickness after the chemical mechanical polish process. A ratio of the first thickness to the second thickness is less than about 1.8.

In some embodiments, the second removal rate of the hard mask is less than about 20 Å/min.

In some embodiments, the chemical mechanical polish process has a third removal rate of the ILD layer. The third removal rate of the ILD layer is greater than the second removal rate of the hard mask.

In some embodiments, a method for manufacturing a semiconductor device includes forming a gate electrode over a substrate; forming a hard mask over the gate electrode; forming an interlayer dielectric (ILD) layer over the hard mask; forming a contact hole in the ILD layer, in which the contact hole exposes a source/drain; filling the contact hole with a conductive material; and applying a chemical mechanical polish process to the ILD layer and the conductive material, in which the chemical mechanical polish process stops at the hard mask, the chemical mechanical polish process uses a slurry containing a boric acid or its derivative, the hard mask has a first thickness prior to the chemical mechanical polish process and a second thickness after the chemical mechanical polish process, and a ratio of the first thickness to the second thickness is less than about 1.8.

In some embodiments, a down force of the chemical mechanical polish process is in a range from about 0.5 psi to 2.5 psi.

In some embodiments, the hard mask includes a metal oxide.

In some embodiments, the second thickness of the hard mask is greater than about 10 nm.

In some embodiments, the slurry includes a carboxylic acid.

In some embodiments, a method includes: forming source/drain epitaxy structures over a semiconductor fin; forming a first interlayer dielectric (ILD) layer covering the source/drain epitaxy structures; forming a gate structure over the semiconductor fin and between the source/drain epitaxy structures; forming a capping layer over the gate structure; thinning the capping layer, such that a top surface of the capping layer is lower than a top surface of the first ILD layer; forming a hard mask layer over the capping layer; forming a second ILD layer spanning the hard mask layer and the first ILD layer; forming, by using an etching operation, a contact hole passing through the first and second ILD layers to one of the source/drain epitaxy structures, the etching operation being performed such that the hard mask layer has a notched corner in the contact hole; filling the contact hole with a conductive material; and performing a chemical mechanical polish (CMP) process on the conductive material until that the notched corner of the hard mask layer is removed.

In some embodiments, a method includes: forming a gate structure across a semiconductor fin, between a pair of gate spacers, and laterally surrounded by a first interlayer dielectric (ILD) layer; depositing a hard mask layer spanning the gate structure, the gate spacers, and the first ILD layer; performing a first chemical mechanical polish (CMP) process on the hard mask layer until the first ILD layer is exposed; forming a second ILD layer over the hard mask layer and the first ILD layer; forming a contact hole in the first and second ILD layers to expose a source/drain epitaxy structure formed on the semiconductor fin; filling the contact hole with a conductive material; and performing a second CMP process on the conductive material until that the hard mask layer is thinned and remains over the gate structure and the gate spacers.

In some embodiments, a method includes forming a gate structure across a semiconductor fin and laterally surrounded by a first interlayer dielectric (ILD) layer; forming a hard mask layer over the gate structure; forming a second ILD layer over the hard mask layer and the first ILD layer; forming a contact hole in the first and second ILD layers to expose a portion of the hard mask layer and a source/drain epitaxy structure adjacent to the gate structure; forming a barrier layer to line the contact hole; after forming the barrier layer, filling the contact hole with a conductive material; and performing a chemical mechanical polish (CMP) process on the conductive material until an interface between the hard mask layer and the barrier layer is exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming source/drain epitaxy structures over a semiconductor fin;
   forming a first interlayer dielectric (ILD) layer covering the source/drain epitaxy structures;
   forming a gate structure over the semiconductor fin and between the source/drain epitaxy structures;
   forming a capping layer over the gate structure;
   thinning the capping layer, such that a top surface of the capping layer is lower than a top surface of the first ILD layer;
   forming a hard mask layer over the capping layer;
   forming a second ILD layer spanning the hard mask layer and the first ILD layer;
   forming, by using an etching operation, a contact hole passing through the first and second ILD layers to one of the source/drain epitaxy structures, the etching operation being performed such that the hard mask layer has a notched corner in the contact hole;
   filling the contact hole with a conductive material; and
   performing a chemical mechanical polish (CMP) process on the conductive material until that the notched corner of the hard mask layer is removed.

2. The method of claim 1, wherein the hard mask layer comprises metal oxide.

3. The method of claim 1, wherein the hard mask layer comprises a material different from the first ILD layer.

4. The method of claim 1, wherein forming the hard mask layer is performed such that a top surface of the hard mask layer is substantially level with a top surface of the first ILD layer.

5. The method of claim 1, further comprising forming a pair of gate spacers on opposite sidewalls of the gate structure prior to forming the source/drain epitaxy structures, wherein forming the hard mask layer is performed such that the hard mask layer spans top surfaces of the gate spacers.

6. The method of claim 1, wherein the capping layer comprises a material different from the first ILD layer.

7. The method of claim 1, wherein the capping layer comprises a nitrogen-containing material.

8. The method of claim 1, wherein after forming the contact hole, a remainder of the second ILD layer covers a portion of a top surface of the hard mask layer.

9. The method of claim 1, wherein a portion of the hard mask layer remains on the capping layer after the CMP process is complete.

10. The method of claim 1, wherein the CMP process uses a slurry containing a boric acid or its derivative.

11. A method, comprising:
    forming a gate structure across a semiconductor fin, between a pair of gate spacers, and laterally surrounded by a first interlayer dielectric (ILD) layer;
    depositing a hard mask layer spanning the gate structure, the gate spacers, and the first ILD layer;
    performing a first chemical mechanical polish (CMP) process on the hard mask layer until the first ILD layer is exposed;
    forming a second ILD layer over the hard mask layer and the first ILD layer;
    forming a contact hole in the first and second ILD layers to expose a source/drain epitaxy structure formed on the semiconductor fin;
    filling the contact hole with a conductive material; and
    performing a second CMP process on the conductive material until that the hard mask layer is thinned and remains over the gate structure and the gate spacers.

12. The method of claim 11, wherein the hard mask layer comprises metal oxide.

13. The method of claim 11, wherein forming the contact hole is performed such that the hard mask layer has a stepped sidewall structure in the contact hole.

14. The method of claim 11, wherein forming the contact hole is performed such that a sidewall of one of the gate spacers is exposed.

15. The method of claim 11, wherein after the first CMP process is complete, the hard mask layer has opposite sidewalls respectively coterminous with outermost sidewalls of the gate spacers.

16. The method of claim 11, wherein the second CMP process uses a slurry containing a boric acid or its derivative.

17. A method, comprising:
    forming a gate structure across a semiconductor fin and laterally surrounded by a first interlayer dielectric (ILD) layer;
    forming a hard mask layer over the gate structure;
    forming a second ILD layer over the hard mask layer and the first ILD layer;
    forming a contact hole in the first and second ILD layers to expose a portion of the hard mask layer and a source/drain epitaxy structure adjacent to the gate structure;
    forming a barrier layer to line the contact hole;
    after forming the barrier layer, filling the contact hole with a conductive material; and
    performing a chemical mechanical polish (CMP) process on the conductive material until an interface between the hard mask layer and the barrier layer is exposed.

18. The method of claim 17, further comprising forming a pair of gate spacers prior to forming the gate structure, wherein the gate structure is formed between the gate spacers, and after the CMP process is complete, a top end of the barrier layer is higher than top ends of the gate spacers.

19. The method of claim 17, wherein the CMP process uses a slurry containing a boric acid or its derivative.

20. The method of claim 17, wherein the second ILD layer has a faster removal rate than the hard mask layer during the CMP process.

* * * * *